United States Patent
Li et al.

(10) Patent No.: US 8,542,529 B2
(45) Date of Patent: Sep. 24, 2013

(54) NON-VOLATILE MEMORY AND METHOD WITH POWER-SAVING READ AND PROGRAM-VERIFY OPERATIONS

(75) Inventors: Yan Li, Milpitas, CA (US); Seungpil Lee, San Ramon, CA (US); Siu Lung Chan, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 13/430,155

(22) Filed: Mar. 26, 2012

(65) Prior Publication Data
US 2012/0243332 A1 Sep. 27, 2012

Related U.S. Application Data

(60) Continuation of application No. 13/114,481, filed on May 24, 2011, now Pat. No. 8,154,923, which is a division of application No. 11/534,297, filed on Sep. 22, 2006, now Pat. No. 7,957,185, which is a division of application No. 11/083,514, filed on Mar. 16, 2005, now Pat. No. 7,251,160.

(51) Int. Cl.
*G11C 11/34* (2006.01)

(52) U.S. Cl.
USPC ............ 365/185.03; 365/185.12; 365/185.17; 365/185.18; 365/185.19; 365/185.21; 365/185.22; 365/185.24; 365/185.33

(58) Field of Classification Search
USPC ............. 365/185.03, 185.12, 185.17, 185.18, 365/185.19, 185.21, 185.22, 185.24, 185.33
See application file for complete search history.

(56) References Cited

U.S. PATENT DOCUMENTS

| | | | |
|---|---|---|---|
| 4,357,685 | A | 11/1982 | Daniele et al. |
| 5,070,032 | A | 12/1991 | Yuan et al. |
| 5,095,344 | A | 3/1992 | Harari |
| 5,163,021 | A | 11/1992 | Mehrotra et al. |
| 5,172,338 | A | 12/1992 | Mehrotra et al. |

(Continued)

FOREIGN PATENT DOCUMENTS

| | | |
|---|---|---|
| JP | 10-233096 A | 9/1998 |
| JP | 2000-276887 A | 10/2000 |

(Continued)

OTHER PUBLICATIONS

Final Notification of Reasons for Refusal for Japanese Application No. 2008-501855 mailed Apr. 24, 2012, 8 pages.

(Continued)

*Primary Examiner* — Trong Phan
(74) *Attorney, Agent, or Firm* — Davis Wright Tremaine LLP

(57) ABSTRACT

A non-volatile memory device capable of reading and writing a large number of memory cells with multiple read/write circuits in parallel has features to reduce power consumption during read, and program/verify operations. A read or program verify operation includes one or more sensing cycles relative to one or more demarcation threshold voltages to determine a memory state. In one aspect, selective memory cells among the group being sensed in parallel have their conduction currents turned off when they are determined to be in a state not relevant to the current sensing cycle. In another aspect, a power-consuming period is minimized by preemptively starting any operations that would prolong the period. In a program/verify operation cells not to be programmed have their bit lines charged up in the program phase. Power is saved when a set of these bit lines avoids re-charging at every passing of a program phase.

8 Claims, 27 Drawing Sheets

POWER-SAVING PROGRAM INHIBIT

(56) References Cited

U.S. PATENT DOCUMENTS

| | | |
|---|---|---|
| 5,299,166 A | 3/1994 | Suh et al. |
| 5,313,421 A | 5/1994 | Guterman et al. |
| 5,315,541 A | 5/1994 | Harari et al. |
| 5,343,063 A | 8/1994 | Yuan et al. |
| 5,392,238 A | 2/1995 | Kirisawa |
| 5,418,752 A | 5/1995 | Harari et al. |
| 5,465,235 A | 11/1995 | Miyamoto |
| 5,546,402 A | 8/1996 | Niijima et al. |
| 5,570,315 A | 10/1996 | Tanaka et al. |
| 5,595,924 A | 1/1997 | Yuan et al. |
| 5,596,526 A | 1/1997 | Assar et al. |
| 5,659,588 A | 8/1997 | Fiedler |
| 5,661,053 A | 8/1997 | Yuan |
| 5,668,752 A | 9/1997 | Hashimoto |
| 5,715,194 A | 2/1998 | Hu |
| 5,748,529 A | 5/1998 | Lee |
| 5,768,192 A | 6/1998 | Eitan |
| 5,771,192 A | 6/1998 | Kim et al. |
| 5,774,397 A | 6/1998 | Endoh et al. |
| 5,903,495 A | 5/1999 | Takeuchi et al. |
| 5,969,990 A | 10/1999 | Arase |
| 5,978,266 A | 11/1999 | Chen et al. |
| 5,978,267 A | 11/1999 | Chen et al. |
| 5,991,202 A | 11/1999 | Derhacobian et al. |
| 6,011,725 A | 1/2000 | Eitan |
| 6,026,014 A | 2/2000 | Sato et al. |
| 6,046,935 A | 4/2000 | Takeuchi et al. |
| 6,061,270 A | 5/2000 | Choi |
| 6,061,280 A | 5/2000 | Aritome |
| 6,128,229 A | 10/2000 | Nobukata |
| 6,151,249 A | 11/2000 | Shirota et al. |
| 6,222,762 B1 | 4/2001 | Guterman et al. |
| 6,233,173 B1 | 5/2001 | Chevallier et al. |
| 6,243,290 B1 | 6/2001 | Kurata et al. |
| 6,414,876 B1 | 7/2002 | Harari et al. |
| 6,643,175 B2 | 11/2003 | Yamauchi et al. |
| 6,657,891 B1 | 12/2003 | Shibata et al. |
| 6,711,068 B2 | 3/2004 | Subramanian et al. |
| 6,738,289 B2 | 5/2004 | Gongwer et al. |
| 6,930,922 B2 | 8/2005 | Mori et al. |
| 6,985,388 B2 | 1/2006 | Cernea |
| 7,035,144 B2 | 4/2006 | Kim et al. |
| 7,046,568 B2 | 5/2006 | Cernea |
| 7,057,939 B2 | 6/2006 | Li et al. |
| 7,064,980 B2 | 6/2006 | Cernea et al. |
| 7,085,159 B2 | 8/2006 | Cernea |
| 7,110,300 B2 | 9/2006 | Visconti |
| 7,151,694 B2 | 12/2006 | Meihong et al. |
| 7,230,851 B2 | 6/2007 | Fong et al. |
| 7,251,160 B2 | 7/2007 | Li et al. |
| 7,257,024 B2 | 8/2007 | Rudeck et al. |
| 7,259,991 B2 | 8/2007 | Aritome |
| 7,570,513 B2 | 8/2009 | Li et al. |
| 7,957,185 B2 | 6/2011 | Li et al. |
| 7,965,562 B2 | 6/2011 | Cernea |
| 7,995,394 B2 | 8/2011 | Dong et al. |
| 8,036,041 B2 | 10/2011 | Li |
| 2002/0109539 A1 | 8/2002 | Takeuchi et al. |
| 2002/0192892 A1 | 12/2002 | Micheloni et al. |
| 2004/0057318 A1 | 3/2004 | Cernea et al. |
| 2004/0109357 A1 | 6/2004 | Cernea et al. |
| 2005/0169082 A1 | 8/2005 | Cernea |
| 2005/0237814 A1 | 10/2005 | Li et al. |
| 2006/0164890 A1 | 7/2006 | Lee |
| 2007/0014161 A1 | 1/2007 | Li et al. |

FOREIGN PATENT DOCUMENTS

| | | |
|---|---|---|
| JP | 2001-067884 A | 3/2001 |
| WO | WO 2004/029975 A1 | 4/2004 |
| WO | WO 2006/101500 | 9/2006 |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

Communication Relating to the Results of the Partial International Search for SanDisk Corporation, International Application No. PCT/US2005/016516 mailed Dec. 28, 2005, 2 pages.

EPO/International Searching Authority, "Notification of Transmittal of the International Search Report and the Written Opinion of the International Searching Authority, or the Declaration," mailed in related international application No. PCT/US2005/016516 on Feb. 13, 2006, 15 pages.

USPTO, "Office Action," for U.S. Appl. No. 11/083,514 mailed Sep. 29, 1996, 12 pages.

Taiwanese Patent Office, "Preliminary Notice of Rejection of the IPO," corresponding in related Taiwan Patent Application No. 094116919, mailed on Dec. 27, 2006, 2 pages.

USPTO, "Office Action," corresponding in related U.S. Appl. No. 11/534,307, mailed on Jan. 26, 2007, 12 pages.

USPTO, "Office Action" mailed in related. U.S. Appl. No. 11/534,307 on Sep. 13, 2007, 27 pages.

Taiwanese Patent Office, "Office Action," corresponding Taiwanese Patent Application No. 094116919 on Dec. 25, 2007, 4 pages (translation included.).

European Patent Office, "Examiner's 1st Report," corresponding European Patent Application No. 05 747 864.6, mailed on Mar. 13, 2008, 2 pages.

USPTO, "Office Action" mailed in related U.S. Appl. No. 11/534,307 on Nov. 14, 2008, 10 pages.

USPTO, "Notice of Allowance and Fee(s) Due" mailed in related U.S. Appl. No. 11/534,307 on Mar. 30, 2009, 15 pages.

China State Intellectual Property Office, "Office Action," corresponding Chinese Patent Application No. 200580049799.2, mailed on Nov. 6, 2009, 5 pages (including translation.).

EPO, "Search Report," corresponding European Patent Application No. 10000203.9, mailed on Mar. 2, 2010, 5 pages.

JPO, "Notification of Reasons for Refusal," corresponding Japanese Patent Application No. 2008-5-1855, mailed on Nov. 24, 2010, 4 pages (including translation.).

JPO, "Notification of Reasons for Refusal," corresponding Japanese Patent Application No. 2008-501855, mailed on Jul. 12, 2011, 6 pages (including translation.).

KRO, "Notice of Preliminary Rejection," corresponding Korean Patent Application No. 2007-7022221, mailed on Jul. 29, 2011, 4 pages (including translation.).

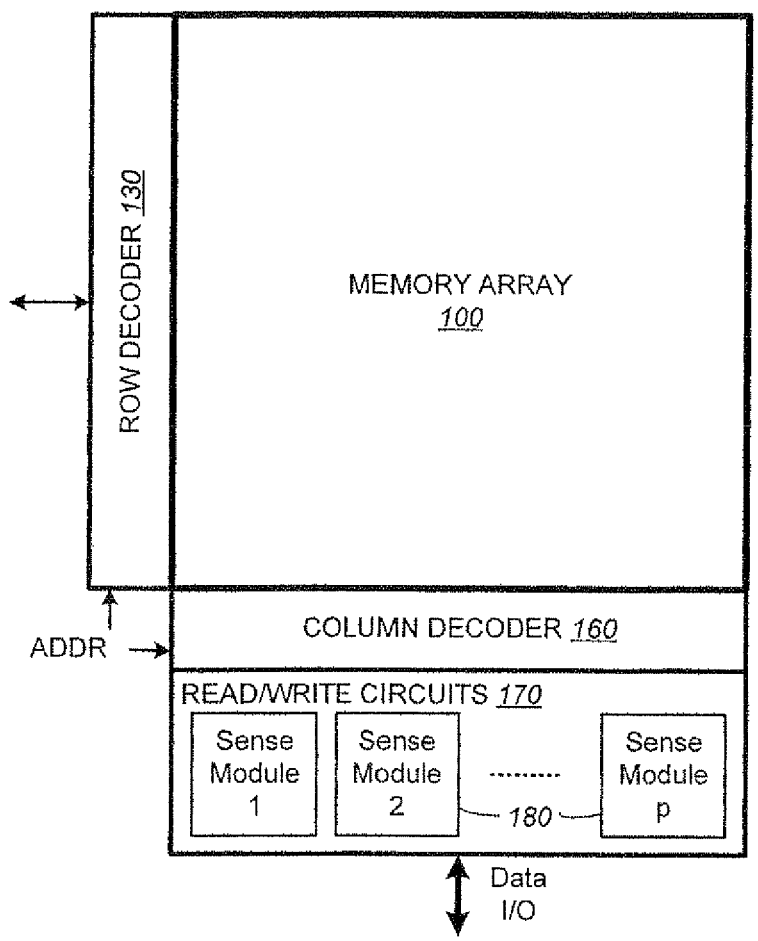
*FIG. 5*   *(Prior Art)*

POWER-SAVING READ

POWER-SAVING READ
(Alternative conduction current comparision view)

Multistate Memory (Conventional Gray Code)

Lower Page Programming (Conventional Gray Code)

Upper Page Programming (Conventional Gray Code)

Lower Page Read (Conventional Gray Code)

Upper Page Read (Conventional Gray Code)

Multistate Memory (LM Gray Code)

Lower Page Programming (LM Gray Code)

Upper Page Programming (LM Gray Code)

Lower Page Read (LM Gray Code)

Upper Page Read (LM Gray Code)

Multistate Memory (LM New Code)

Lower Page Programming (LM New Code)

Upper Page Programming (LM New Code)

Lower Page Read (LM New Code)

Upper Page Read (LM New Code)

3-PASS READ

Program-Verify Cycling

PROGRAM PHASE TIMING

POWER-SAVING PROGRAM VERIFY
(Ignoring program-inhibited bits)

POWER-SAVING PROGRAM VERIFY
(Select bits with relevant memory state)

CONVENTIONAL PRECHARGE TIMING FOR SENSING

JUMP-START WL PRECHARGE TIMING FOR SENSING

POWER-SAVING PROGRAM INHIBIT

NON-VOLATILE MEMORY AND METHOD WITH POWER-SAVING READ AND PROGRAM-VERIFY OPERATIONS

CROSS REFERENCE TO RELATED APPLICATION

This application is a continuation of U.S. patent application Ser. No. 13/114,481 filed on May 24, 2011, now U.S. Pat. No. 8,154,923, which is a divisional of U.S. patent application Ser. No. 11/534,297, filed on Sep. 22, 2006, now U.S. Pat. No. 7,957,185, which is a divisional of U.S. patent application Ser. No. 11/083,514, filed on Mar. 16, 2005, now U.S. Pat. No. 7,251,160, which application and patent are incorporated herein in their entirety by this reference. This application is also related to U.S. patent application Ser. No. 11/534,307, filed on Sep. 22, 2006, now U.S. Pat. No. 7,570,513, also incorporated herein in its entirety by this reference.

FIELD OF THE INVENTION

This invention relates generally to non-volatile semiconductor memory such as electrically erasable programmable read-only memory (EEPROM) and flash EEPROM, and specifically ones implementing power-saving features during read and program verify operations.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, retaining its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

Examples of Non-Volatile Memory Cells

The memory devices typically comprise one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing. There are many commercially successful non-volatile solid-state memory devices being used today. These memory devices may employ different types of memory cells, each type having one or more charge storage element.

FIGS. 1A-1E illustrate schematically different examples of non-volatile memory cells.

FIG. 1A illustrates schematically a non-volatile memory in the form of an EEPROM cell with a control gate, a source, a drain and a floating gate for storing charge. An electrically erasable and programmable read-only memory (EEPROM) has a similar structure to EPROM, but additionally provides a mechanism for loading and removing charge electrically from its floating gate upon application of proper voltages without the need for exposure to UV radiation. Examples of such cells and methods of manufacturing them are given in U.S. Pat. No. 5,595,924.

FIG. 1B illustrates schematically a flash EEPROM cell having both a select gate and a control or steering gate. The memory cell 10 has a "split-channel" 12 between source 14 and drain 16 diffusions. A cell is formed effectively with two transistors T1 and T2 in series and with its terminals coupled respectively to bit lines BL-left and BL-right. T1 serves as a memory transistor having a floating gate 20 and a control gate 30. The floating gate is capable of storing a selectable amount of charge. The amount of current that can flow through the T1's portion of the channel depends on the voltage on the control gate 30 and the amount of charge residing on the intervening floating gate 20. T2 serves as a select transistor having a select gate 40. When T2 is turned on by a voltage at the select gate 40, it allows the current in the T1's portion of the channel to pass between the source and drain. The select transistor provides a switch along the source-drain channel independent of the voltage at the control gate. One advantage is that it can be used to turn off those cells that are still conducting at zero control gate voltage due to their charge depletion (positive) at their floating gates. The other advantage is that it allows source side injection programming to be more easily implemented.

One simple embodiment of the split-channel memory cell is where the select gate and the control gate are connected to the same word line as indicated schematically by a dotted line shown in FIG. 1B. This is accomplished by having a charge storage element (floating gate) positioned over one portion of the channel and a control gate structure (which is part of a word line) positioned over the other channel portion as well as over the charge storage element. This effectively forms a cell with two transistors in series, one (the memory transistor) with a combination of the amount of charge on the charge storage element and the voltage on the word line controlling the amount of current that can flow through its portion of the channel, and the other (the select transistor) having the word line alone serving as its gate. Examples of such cells, their uses in memory systems and methods of manufacturing them are given in U.S. Pat. Nos. 5,070,032, 5,095,344, 5,315,541, 5,343,063, and 5,661,053.

A more refined embodiment of the split-channel cell shown in FIG. 1B is when the select gate and the control gate are independent and not connected by the dotted line between them. One implementation has the control gates of one column in an array of cells connected to a control (or steering) line perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the charge storage element to a desired level through an electric field (capacitive) coupling between the word line and the charge storage element. It is often difficult to perform both of these functions in an optimum manner with a single voltage. With the separate control of the control gate and the select gate, the word line need only perform function (1), while the added control line performs function (2). This capability allows for design of higher performance programming where the programming voltage is geared to the targeted data. The use of independent control (or steering) gates in a flash EEPROM array is described, for example, in U.S. Pat. Nos. 5,313,421 and 6,222,762.

FIG. 1C illustrates schematically another flash EEPROM cell having dual floating gates and independent select and control gates. The memory cell 10' is similar to that of FIG. 1B except it effectively has three transistors in series. In this type of cell, two storage elements (i.e., that of T1-left and T1-right) are included over its channel between source and drain diffusions with a select transistor 12 in between them. The memory transistors have floating gates 20" and 20', and control gates 30" and 30', respectively. The select transistor T2 is controlled by a select gate 40'. At any one time, only one of the pair of memory transistors is accessed for read or write. When the storage unit T1-left is being accessed, both the T2 and T1-right are turned on to allow the current in the T1-left's portion of the channel to pass between the source and the drain. Similarly, when the storage unit T1-right is being accessed, T2 and T1-left are turned on. Erase is effected by having a portion of the select gate polysilicon in close proximity to the floating gate and applying a substantial positive voltage (e.g. 20V) to the select gate so that the electrons stored within the floating gate can tunnel to the select gate polysilicon.

FIG. 1D illustrates schematically a string of memory cells organized into an NAND cell. An NAND cell 50 consists of a series of memory transistors M1, M2, ... Mn (n=4, 8, 16 or higher) daisy-chained by their sources and drains. A pair of select transistors S1, S2 controls the memory transistors chain's connection to the external via the NAND cell's source terminal 54 and drain terminal 56. In a memory array, when the source select transistor S1 is turned on, the source terminal is coupled to a source line. Similarly, when the drain select transistor S2 is turned on, the drain terminal of the NAND cell is coupled to a bit line of the memory array. Each memory transistor in the chain has a charge storage element to store a given amount of charge so as to represent an intended memory state. A control gate of each memory transistor (such as Control Gate 1 or Control Gate 2, ..., or Control Gate n) provides control over read and write operations. A control gate of each of the select transistors S1, S2 provides control access to the NAND cell via its source terminal 54 and drain terminal 56 respectively.

When an addressed memory transistor within an NAND cell is read and verified during programming, its control gate is supplied with an appropriate voltage. At the same time, the rest of the non-addressed memory transistors in the NAND cell 50 are fully turned on by application of sufficient voltage on their control gates. In this way, a conductive path is effective created from the source of the individual memory transistor to the source terminal 54 of the NAND cell and likewise for the drain of the individual memory transistor to the drain terminal 56 of the cell. Memory devices with such NAND cell structures are described in U.S. Pat. Nos. 5,570,315, 5,903, 495, 6,046,935.

FIG. 1E illustrates schematically a non-volatile memory with a dielectric layer for storing charge. Instead of the conductive floating gate elements described earlier such as in FIG. 1A, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011, 725 disclose a nonvolatile memory cell having a trapping dielectric sandwiched between two silicon dioxide layers. Multi-state data storage is implemented by separately reading the binary states of the spatially separated charge storage regions within the dielectric.

Memory Array

A memory device typically comprises of a two-dimensional array of memory cells arranged in rows and columns and addressable by word lines and bit lines. The array can be formed according to an NOR type or an NAND type architecture.

NOR Array

FIG. 2 illustrates an example of an NOR array 100 of memory cells. Memory devices with an NOR type architecture have been implemented with cells of the type illustrated in FIG. 1B or 1C. Each row of memory cells are connected by their sources and drains in a daisy-chain manner. This design is sometimes referred to as a virtual ground design. Each memory cell 10 has a source 14, a drain 16, a control gate 30 and a select gate 40. The cells in a row have their select gates connected to word line 42. The cells in a column have their sources and drains respectively connected to selected bit lines 34 and 36. In some embodiments where the memory cells have their control gate and select gate controlled independently, a steering line 32 also connects the control gates of the cells in a column.

Many flash EEPROM devices are implemented with memory cells where each is formed with its control gate and select gate connected together. In this case, there is no need for steering lines and a word line simply connects all the control gates and select gates of cells along each row. Examples of these designs are disclosed in U.S. Pat. Nos. 5,172,338 and 5,418,752. In these designs, the word line essentially performed two functions: row selection and supplying control gate voltage to all cells in the row for reading or programming.

NAND Array

FIG. 3 illustrates an example of an NAND array of memory cells, such as that shown in FIG. 1D. Along each column of NAND chains, a bit line 36 is coupled to the drain terminal 56 of each NAND chain 50. Along each row of NAND chains, a source line 34 may connect all their source terminals 54. Also the control gates of the NAND chains along a row are connected to a series of corresponding word lines. An entire row of NAND chains can be addressed by turning on the pair of select transistors (see FIG. 1D) with appropriate voltages on their control gates via the connected word lines. When a memory transistor representing a memory cell within the NAND chain is being read, the remaining memory transistors in the chain are turned on hard via their associated word lines so that the current flowing through the chain is essentially dependent upon the level of charge stored in the cell being read. An example of an NAND architecture array and its operation as part of a memory system is found in U.S. Pat. Nos. 5,570,315, 5,774,397 and 6,046,935.

Block Erase

Programming of charge storage memory devices can only result in adding more charge to its charge storage elements. Therefore, prior to a program operation, existing charge in a charge storage element must be removed (or erased). Erase circuits (not shown) are provided to erase one or more blocks of memory cells. A non-volatile memory such as EEPROM is referred to as a "Flash" EEPROM when an entire array of cells, or significant groups of cells of the array, is electrically erased together (i.e., in a flash). Once erased, the group of cells can then be reprogrammed. The group of cells erasable together may consist of one or more addressable erase unit. The erase unit or block typically stores one or more pages of data, the page being the unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

Read/Write Circuits

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current $I_{REF}$). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

FIG. 4 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Six memory states ("1"-"6") may be demarcated by partitioning the threshold window into five regions in interval of 0.5V each. For example, if a reference current, $I_{REF}$ of 2 µA is used as shown, then the cell programmed with Q1 may be considered to be in a memory state "1" since its curve intersects with $I_{REF}$ in the region of the threshold window demarcated by $V_{CG}$=0.5V and 1.0V. Similarly, Q4 is in a memory state "5".

As can be seen from the description above, the more states a memory cell is made to store, the more finely divided is its threshold window. This will require higher precision in programming and reading operations in order to be able to achieve the required resolution.

U.S. Pat. No. 4,357,685 discloses a method of programming a 2-state EPROM in which when a cell is programmed to a given state, it is subject to successive programming voltage pulses, each time adding incremental charge to the floating gate. In between pulses, the cell is read back or verified to determine its source-drain current relative to the breakpoint level. Programming stops when the current state has been verified to reach the desired state. The programming pulse train used may have increasing period or amplitude.

Prior art programming circuits simply apply programming pulses to step through the threshold window from the erased or ground state until the target state is reached. Practically, to allow for adequate resolution, each partitioned or demarcated region would require at least about five programming steps to transverse. The performance is acceptable for 2-state memory cells. However, for multi-state cells, the number of steps required increases with the number of partitions and therefore, the programming precision or resolution must be increased. For example, a 16-state cell may require on average at least 40 programming pulses to program to a target state.

FIG. 5 illustrates schematically a memory device with a typical arrangement of a memory array 100 accessible by read/write circuits 170 via row decoder 130 and column decoder 160. As described in connection with FIGS. 2 and 3, a memory transistor of a memory cell in the memory array 100 is addressable via a set of selected word line(s) and bit line(s). When an address ADDR is supplied, the row decoder 130 selects one or more word lines and the column decoder 160 selects one or more bit lines in order to apply appropriate voltages to the respective gates of the addressed memory transistor. Read/write circuits 170 are provided to read or write (program) the memory states of addressed memory transistors. The read/write circuits 170 comprise a number of read/write or sense modules 180 (e.g., Sense Module 1, Sense Module 2, ..., Sense Module p) connectable via bit lines to memory elements in the array and the read/write data is exchanged with the external via a Data I/O.

Factors Affecting Read/Write Performance and Accuracy

In order to improve read and program performance, multiple charge storage elements or memory transistors in an array are read or programmed in parallel. Thus, a logical "page" of memory elements are read or programmed together. In existing memory architectures, a row typically contains several interleaved pages. All memory elements of a page will be read or programmed together. The column decoder will selectively connect each one of the interleaved pages to a corresponding number of read/write modules. For example, in one implementation, the memory array is designed to have a page size of 532 bytes (512 bytes plus 20 bytes of overheads.) If each column contains a drain bit line and there are two interleaved pages per row, this amounts to 8512 columns with each page being associated with 4256 columns. There will be 4256 sense modules connectable to read or write in parallel either all the even bit lines or the odd bit lines. In this way, a page of 4256 bits (i.e., 532 bytes) of data in parallel are read from or programmed into the page of memory elements. The read/write modules forming the read/write circuits 170 can be arranged into various architectures.

As mentioned before, conventional memory devices improve read/write operations by operating in a massively parallel manner on all even or all odd bit lines at a time. This "alternate-bit-line" architecture of a row consisting of two interleaved pages will help to alleviate the problem of fitting the block of read/write circuits. It is also dictated by consideration of controlling bit-line to bit-line capacitive coupling. A block decoder is used to multiplex the set of read/write modules to either the even page or the odd page. In this way, whenever one set bit lines are being read or programmed, the interleaving set can be grounded to minimize immediate neighbor coupling.

However, the interleaving page architecture is disadvantageous in at least three respects. First, it requires additional multiplexing circuitry. Secondly, it is slow in performance. To finish read or program of memory cells connected by a word line or in a row, two read or two program operations are required. Thirdly, it is also not optimum in addressing other disturb effects such as field coupling between neighboring charge storage elements at the floating gate level when the two neighbors are programmed at different times, such as separately in odd and even pages.

United States Patent Publication No. 2004-0057318-A1 discloses a memory device and a method thereof that allow sensing a plurality of contiguous memory cells in parallel. For example, all memory cells along a row sharing the same word lines are read or programmed together as a page. This "all-bit-line" architecture doubles the performance of the "alternate-bit-line" architecture while minimizing errors caused by neighboring disturb effects. However, sensing all bit lines does bring up the problem of cross-talk between neighboring bit lines due induced currents from their mutual capacitance. This is addressed by keeping the voltage difference between each adjacent pair of bit lines substantially independent of time while their conduction currents are being sensed. When this condition is imposed, all displacement currents due to the various bit lines' capacitance drop out since they all depend on a time varying voltage difference. The sensing circuit coupled to each bit line has a voltage clamp on the bit line so that the potential difference on any adjacent pair of connected bit lines is time-independent. With the bit line voltage clamped, the conventional method of sensing the discharge due to the bit line capacitance can not be applied. Instead, the sensing circuit and method allow determination of a memory cell's conduction current by noting the rate it discharges or charges a given capacitor independent of the bit line. This will allow a sensing circuit independent of the architecture of the memory array (i.e., independent of the bit line capacitance.) Especially, it allows the bit line voltages to be clamped during sensing in order to avoid bit line crosstalk.

Power consumption is one important consideration of memory devices, and especially for the ones with the all-bit-line architecture. With massively parallel sensing, the number of memory cells with conduction current flow will compound. The power consumption is even more acute for the all-bit-line architecture where there is potentially twice the number of memory cells operating in parallel than that of the alternate bit-line architecture. Furthermore, in the scheme with constant voltage bit line, the bit line is precharged while connected to the cell to maintain stable voltage conditions. This means in the precharge operation during sensing, power is expended not only to charge up the bit line but also to work against the draining cell current.

Therefore there is a general need for high performance and high capacity non-volatile memory with reduced power consumption. In particular, there is a need for a compact non-volatile memory with enhanced read and program performance that is power efficient.

SUMMARY OF INVENTION

According to one aspect of the invention, when sensing a page of multi-state memory cells over one or more passes, those memory cells of the page known to be irrelevant in a pass have their conduction currents turned off during the sensing to save power.

According to another aspect of the invention, when programming a page of memory cells over multiple passes, those memory cells of the page known to be irrelevant in a pass have their conduction currents turned off during a program verify operation to save power.

According to another aspect of the invention, during a sensing operation, a power-consuming period is minimized by preemptively starting any operations that prolongs the period. In the preferred embodiment, the operation for precharging unselected word lines of the memory array is preemptively started before a current sensing cycle so that it does not prolong the period a selected bit line is subjected to precharging.

According to yet another aspect of the invention, the unselected word line precharge is only performed at the beginning of a sensing cycle comprising multiple passes of sensing relative to multiple threshold voltages.

The saving in power by the various aspects of the present invention allows for a more power efficient memory device. The saving in power consumption can amount to as much as fifty percent as compared to existing read/write circuits. In particular, a larger number of read/write modules can be used in parallel without requiring a bulky power supply.

According to another aspect of the invention, in a program operation having cycles of alternate program and verify phases, a method of programming comprising charging up the bit lines of memory cells that are program inhibited to a predetermined voltage while not charging up the bit lines of memory cells that are to be programmed at the beginning of the program phase; and discharging the bit lines of memory cells that are to be programmed while not discharging the bit lines of the memory cells that are program inhibited at the end of the program phase.

In one embodiment, at least a subset of the undischarged bit lines will retain its voltage when cycling between alternate program and verify phases, thereby eliminating the power-consuming charging and discharging of those bit lines in every program phase. The subset of the undischarged bit line corresponds to memory cells that have been verified relative to a current demarcation threshold voltage.

In another embodiment, all the undischarged bit lines will retain it voltage when cycling between alternate program and verify phases, thereby eliminating the power-consuming charging and discharging of those bit lines in every program phase. This is accomplished by preventing the lockout bit lines to be discharged by their conducting cells. A switch is provided between each memory cell or NAND chain and its associated bit line. The switch is responsive to a voltage condition on its associated bit line to connect the memory cell or NAND chain to its associated bit line when the bit line is substantially at zero voltage and to disconnect the memory cell or NAND chain from its associated bit line when the bit line is substantially at a supply voltage.

Additional features and advantages of the present invention will be understood from the following description of its preferred embodiments, which description should be taken in conjunction with the accompanying drawings.

BRIEF DESCRIPTION OF THE DRAWINGS

FIG. 5 illustrates schematically a typical arrangement of a memory array accessible by read/write circuits via row and column decoders.

DETAILED DESCRIPTION OF THE PREFERRED EMBODIMENTS

Figure 6A:
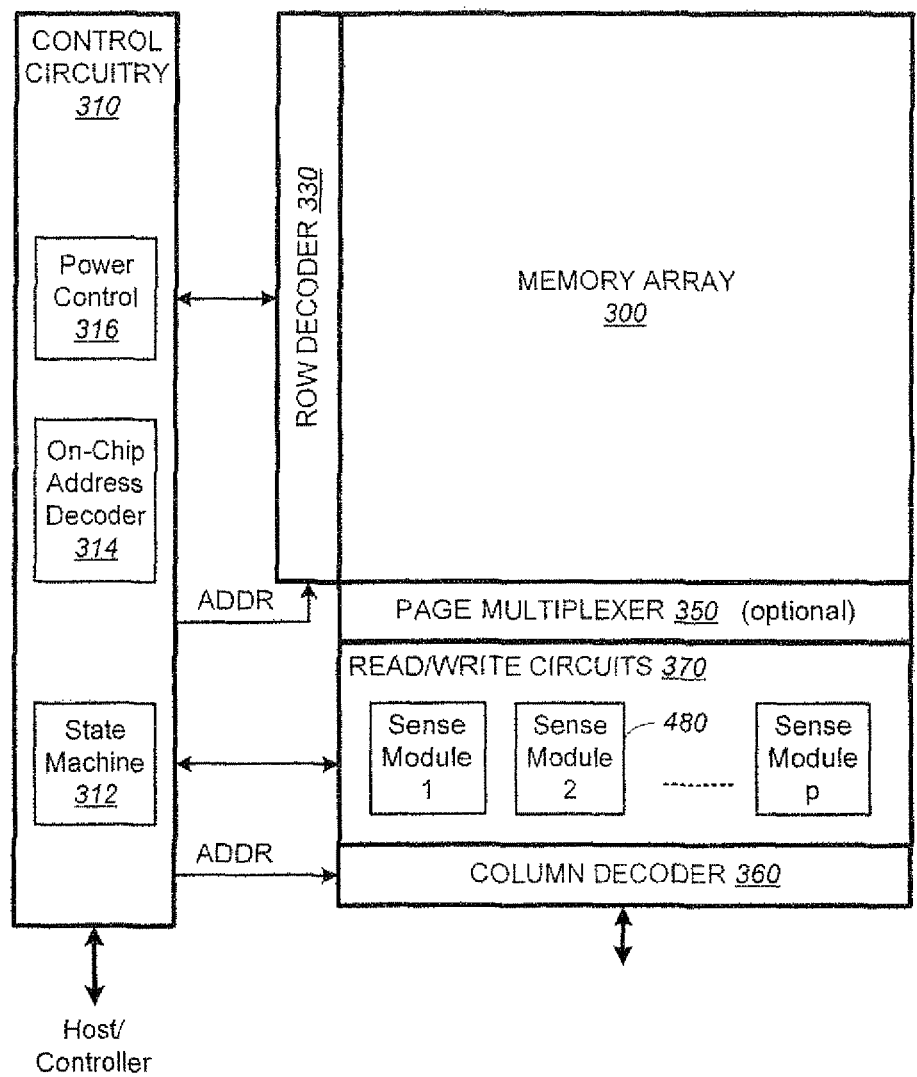
FIG. 6A illustrates schematically a compact memory device having a bank of read/write circuits, which provides the context in which the present invention is implemented.

FIG. 6A illustrates schematically a compact memory device having a bank of read/write circuits, which provides the context in which the present invention is implemented. The memory device includes a two-dimensional array of memory cells 300, control circuitry 310, and read/write circuits 370. The memory array 300 is addressable with addresses ADDR by word lines via a row decoder 330 and by bit lines via a column decoder 360. The read/write circuits 370 is implemented as a bank of sense modules 480 (such as Sense Module 1, Sense Module 2, . . . , and Sense Module p) and allows a block (also referred to as a "page") of memory cells to be read or programmed in parallel. In a preferred embodiment, a page is constituted from a contiguous row of memory cells. In another embodiment, where a row of memory cells are partitioned into multiple blocks or pages, a block (or page) multiplexer 350 is optionally provided to multiplex the read/write circuits 370 to the individual blocks.

The control circuitry 310 cooperates with the read/write circuits 370 to perform memory operations on the memory array 300. The control circuitry 310 includes a state machine 312, an on-chip address decoder 314 and a power control module 316 and is in communication with a host or a controller. The state machine 312 provides chip level control of memory operations. The on-chip address decoder 314 provides an address interface between that used by the host or a memory controller to the hardware address used by the decoders 330 and 370. The power control module 316 controls the power and voltages supplied to the word lines and bit lines during memory operations.

Figure 6B:
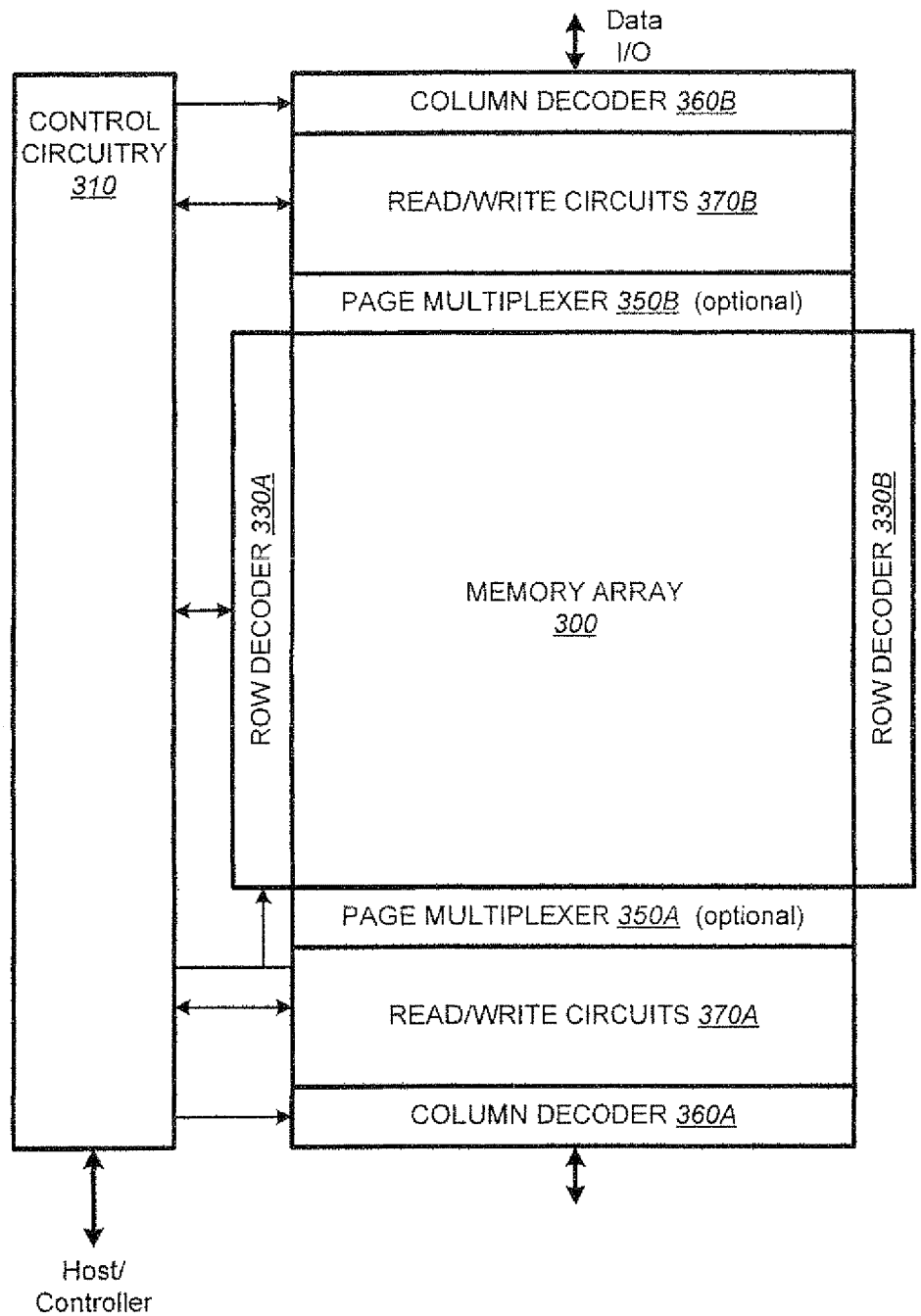
FIG. 6B illustrates a preferred arrangement of the compact memory device shown in FIG. 6A.

FIG. 6B illustrates a preferred arrangement of the compact memory device shown in FIG. 6A. Access to the memory array 300 by the various peripheral circuits is implemented in a symmetric fashion, on opposite sides of the array so that access lines and circuitry on each side are reduced in half. Thus, the row decoder is split into row decoders 330A and 330B and the column decoder into column decoders 360A and 360B. In the embodiment where a row of memory cells are partitioned into multiple blocks, the block multiplexer 350 is split into block multiplexers 350A and 350B. Similarly, the read/write circuits are split into read/write circuits 370A connecting to bit lines from the bottom and read/write circuits 370B connecting to bit lines from the top of the array 300. In this way, the density of the read/write modules, and therefore that of the bank of sense modules 480, is essentially reduced by one half.

The entire bank of p sense modules 480 operating in parallel allows a block (or page) of p cells along a row to be read or programmed in parallel. One example memory array may have p=512 bytes (512×8 bits). In the preferred embodiment, the block is a run of the entire row of cells. In another embodiment, the block is a subset of cells in the row. For example, the subset of cells could be one half of the entire row or one quarter of the entire row. The subset of cells could be a run of contiguous cells or one every other cell, or one every predetermined number of cells. Each sense module includes a sense amplifier for sensing the conduction current of a memory cell. A preferred sense amplifier is disclosed in United States Patent Publication No. 2004-0109357-A1, the entire disclosure of which is hereby incorporated herein by reference.

Power-Saving Read Operation

According to one aspect of the invention, when sensing a page of multi-state memory cells over one or more passes, those memory cells of the page known to be irrelevant in a pass have their conduction currents turned off during the sensing to save power.

Figure 1A:
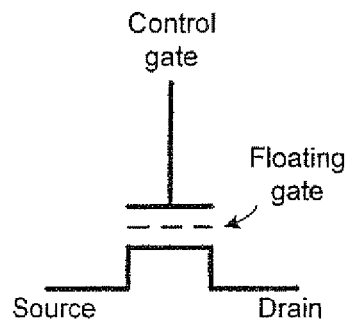
FIGS. 1A-1E illustrate schematically different examples of non-volatile memory cells.
Figure 1B:
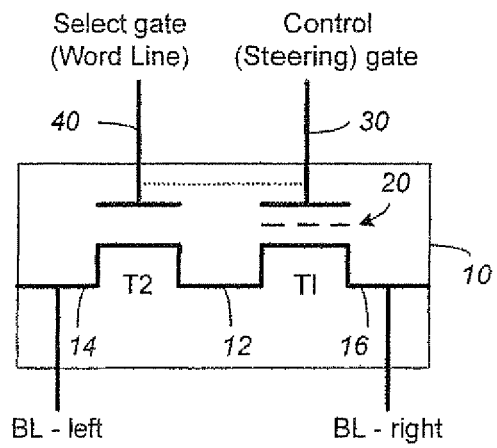
Figure 1C:
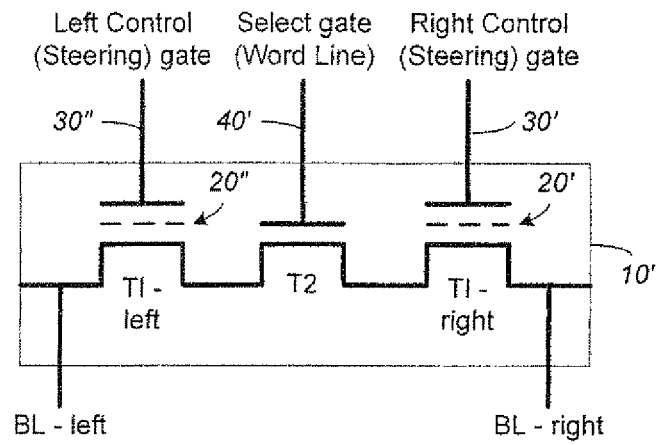
Figure 1E:
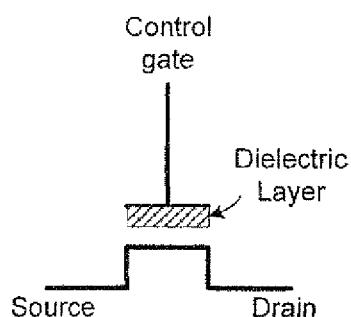
Figure 1D:
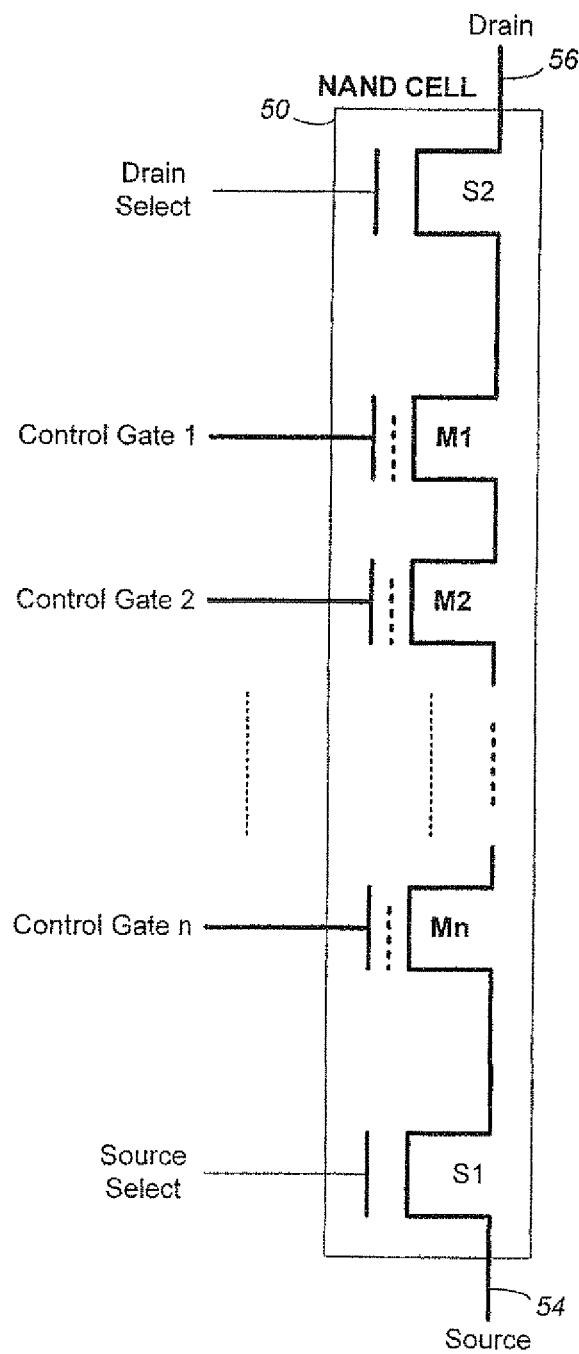
Figure 2:
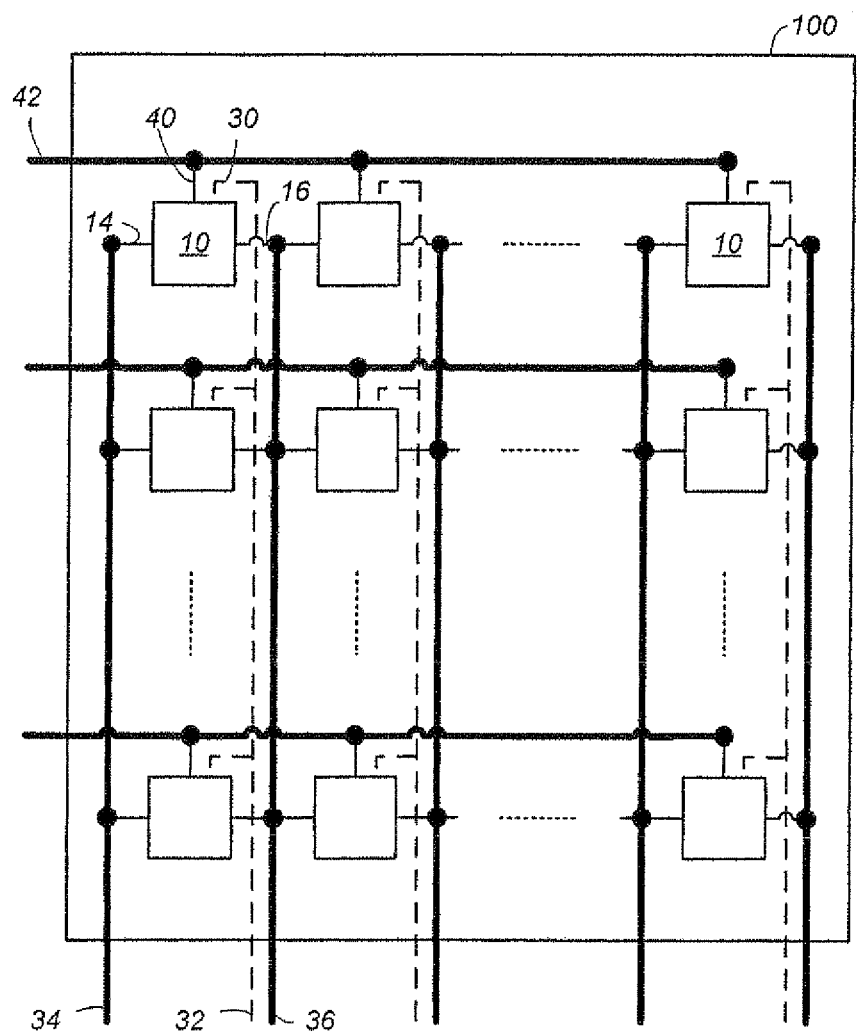
FIG. 2 illustrates an example of an NOR array of memory cells.
Figure 3:
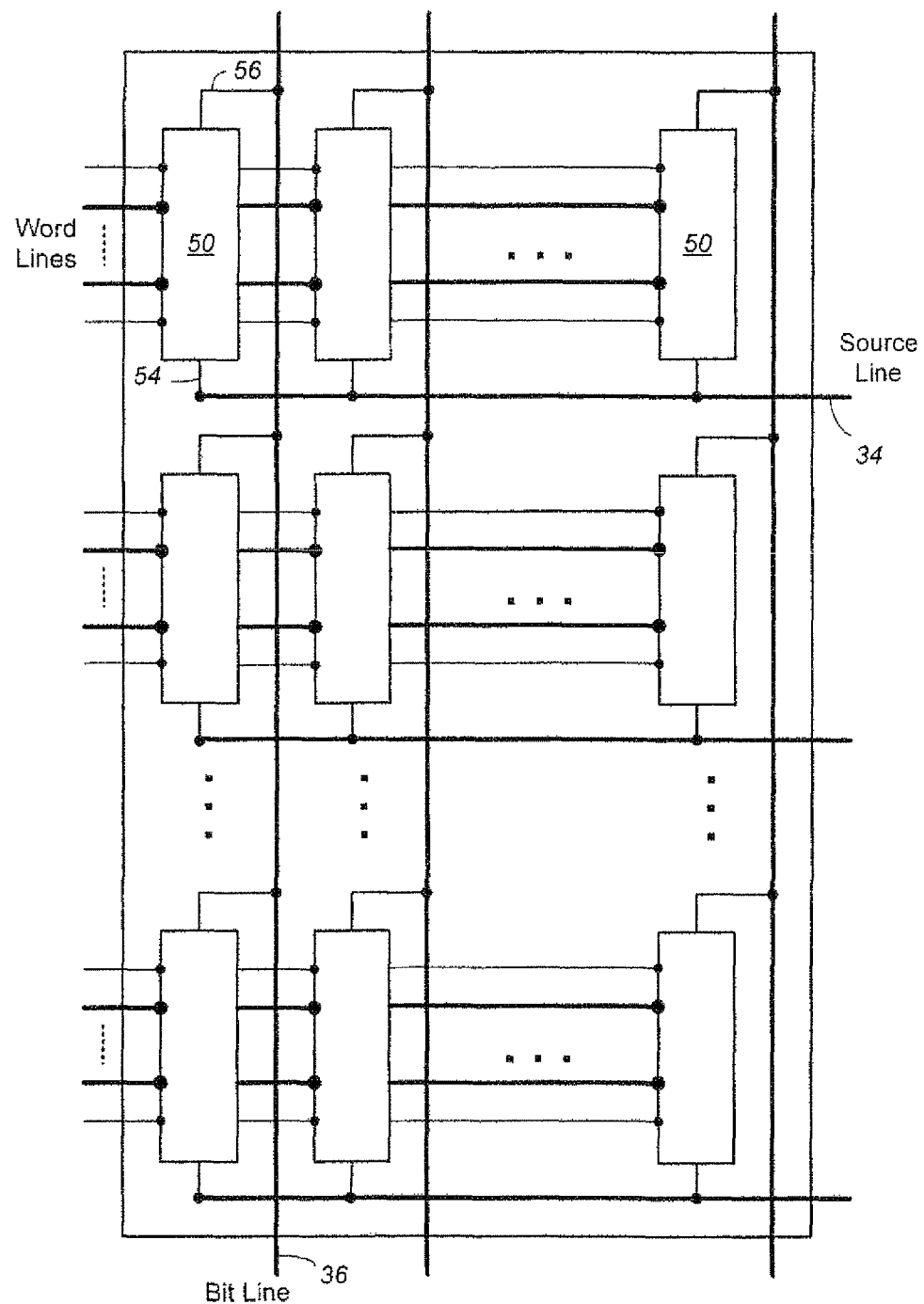
FIG. 3 illustrates an example of an NAND array of memory cells, such as that shown in FIG. 1D.
Figure 4:
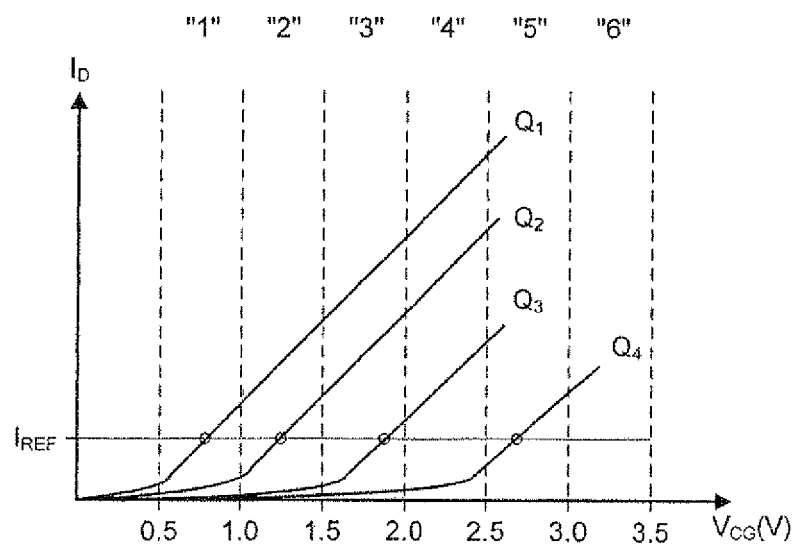
FIG. 4 illustrates the relation between the source-drain current and the control gate voltage for four different charges Q1-Q4 that the floating gate may be storing at any one time.

In a multi-state memory device as shown in FIG. 4, the memory cell has its threshold voltage window partitioned into several regions, each representing a memory state. The regions are demarcated by a set of predetermined demarcation threshold voltages. When sensing a memory cell, it amounts to determining in which region the cell's programmed threshold voltage lies. This is accomplished by comparing the programmed threshold voltage with each of the demarcation threshold voltages in turn. At each pass, the cells with programmed threshold voltages lower than the current demarcation threshold voltage can be distinguished. If the demarcation threshold voltages are scanned in ascending order during the passes, the memory cells with smaller programmed threshold voltages and therefore higher conduction current will be identified first. Once the memory cells are identified, they are irrelevant to subsequent passes, which only seek to identify higher programmed threshold voltages or lower conduction currents. Thus, the power-saving scheme prescribes turning off the conduction current of the previously identified memory cells which are no longer relevant to the current sensing pass. In this way, with each sensing pass, less and less power will be consumed.

A read operation determines the memory state of a memory cell by sensing the threshold voltage programmed in the cell. The power-saving scheme is applicable in a read operation having more than one pass of sensing.

Figure 7A:
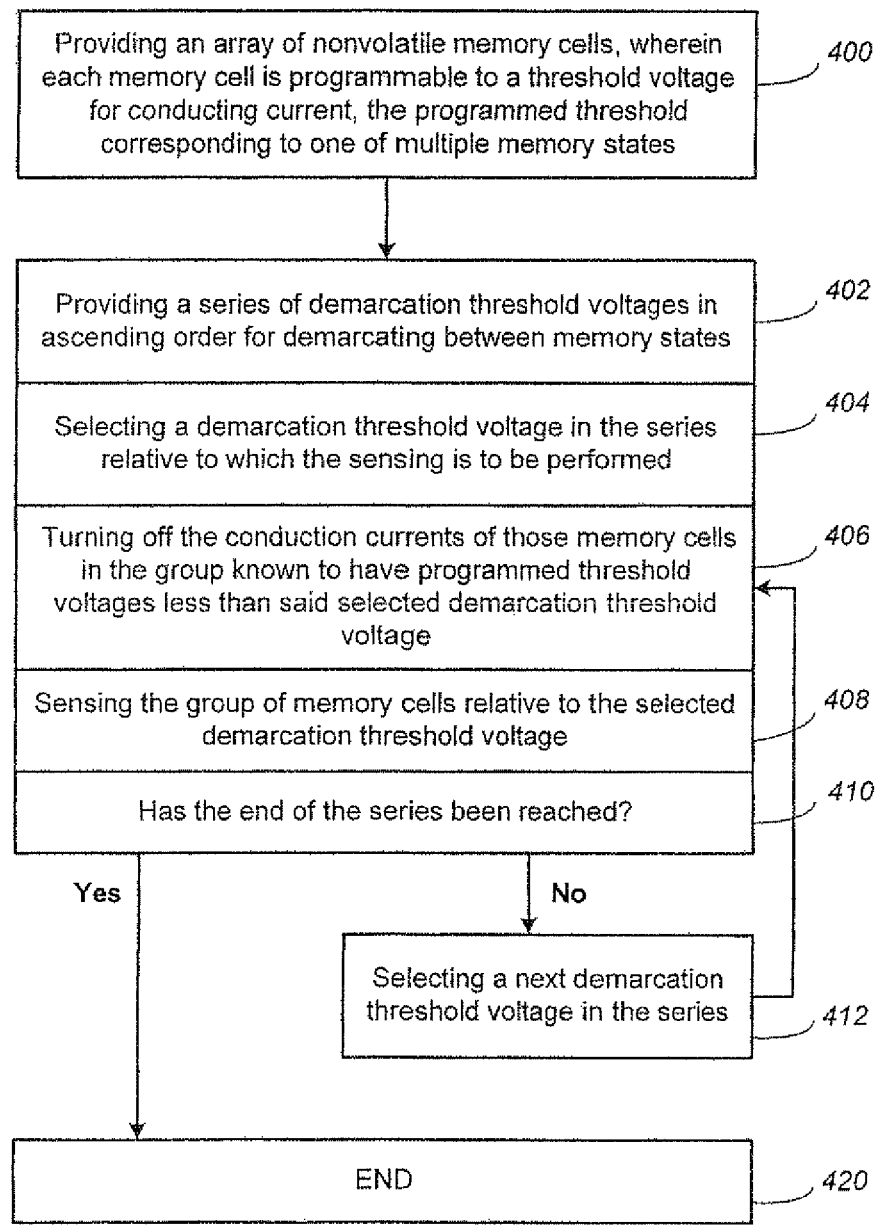
FIG. 7A is a flowchart for a power-saving read operation, according to a preferred embodiment of the invention.

FIG. 7A is a flowchart for a power-saving read operation, according to a preferred embodiment of the invention.

STEP 400: Providing an array of nonvolatile memory cells, wherein each memory cell is programmable to a threshold voltage for conducting current, corresponding to one of multiple memory states.

STEP 402: Providing a series of demarcation threshold voltages in ascending order for demarcating between memory states corresponding to increasing programmed threshold voltages.

STEP 404: Selecting a demarcation threshold voltage in the series relative to which the sensing is to be performed.

STEP 406: Turning off the conduction currents of those memory cells in the group known to have programmed threshold voltages less than said selected demarcation threshold voltage. Before the first sensing, the read operation is agnostic about the threshold voltages programmed into any of the cells in the page. So no cell will have its conduction current turn off for this consideration.

STEP 408: Sensing the group of memory cells relative to the selected demarcation threshold voltage.

STEP 410: Has the end of the series been reached? If not proceed to STEP 412. Otherwise proceed to STEP 420.

STEP 412: Selecting a next demarcation threshold voltage in the series. Proceed to STEP 406

STEP 420: End.

As explained earlier, a nonvolatile memory cell has a charge storage element which allows charges on it to be altered by a program operation. A definite relation exists between the amount of charge programmed and the threshold voltage on its control gate to turn on its drain source conduction current. The relation can be expressed in two equivalent views. In a conduction current view, given a voltage on the control gate, those memory cells with less charge programmed will have a higher conduction current, with the unprogrammed state having the highest conduction current. In a threshold voltage view, given a reference current, those memory cells with less charge programmed will have a lower threshold voltage, with the unprogrammed state having the lowest threshold voltage. Thus, the sensing between two different memory states can equivalently be considered as either discriminating between two conduction currents given a threshold voltage, or discriminating between two threshold voltages given a reference conduction current.

Figure 7B:
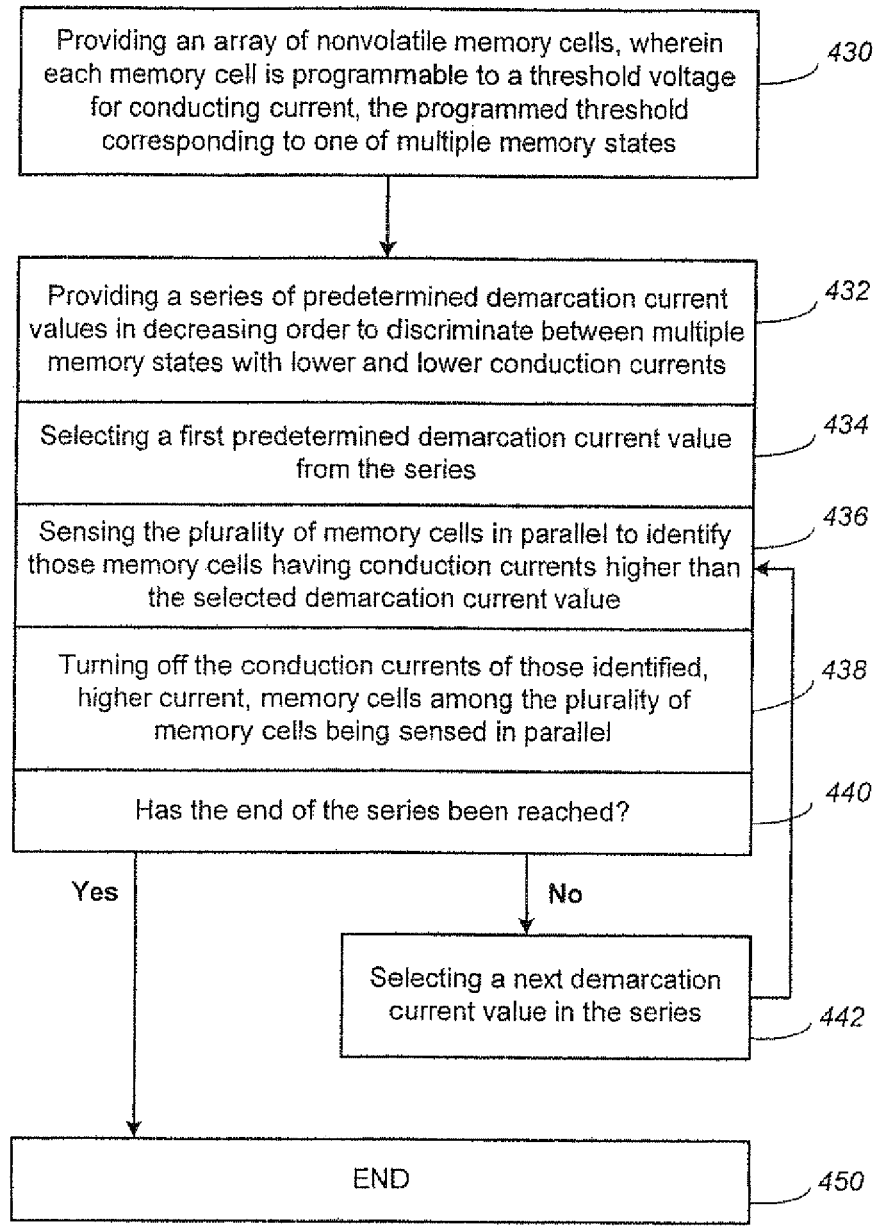
FIG. 7B illustrates a flowchart for a power-saving read operation of FIG. 7A from the view point of a conduction current comparison.

FIG. 7B illustrates a flowchart for a power-saving read operation of FIG. 7A from the view point of a conduction current comparison.

STEP 430: Providing an array of nonvolatile memory cells, wherein each memory cell is programmable to a threshold voltage for conducting current, corresponding to one of multiple memory states.

STEP 432: Providing a series of predetermined demarcation current values in decreasing order to discriminate between multiple memory states with lower and lower conduction currents.

STEP 434: Selecting a first predetermined demarcation current value from the series.

STEP 436: Sensing the plurality of memory cells in parallel to identify those memory cells having conduction currents higher than the selected demarcation current value.

STEP 438: Turning off the conduction currents of those identified, higher current, memory cells among the plurality of memory cells being sensed in parallel.

STEP 440: Has the end of the series been reached? If not proceed to STEP 442. Otherwise proceed to STEP 450.

STEP 442: Selecting a next demarcation threshold voltage in the series. Proceed to STEP 436

STEP 450: End.

Reading and Programming Considerations for Multistate Memory

FIGS. 8A-8E, 9A-9E, 10A-10E respectively illustrate three examples of multi-bit encoding for a 4-state memory. In a 4-state memory cell, the four states can be represented by two bits. One existing technique is to use a 2-pass programming to program such memory. A first bit (lower page bit) is programmed by a first pass. Subsequently, the same cell is programmed in a second pass to represent a desired second bit (upper page bit). In order not to change the value of the first bit in the second pass, the memory state representation of the second bit is made to depend on the value of the first bit.

FIGS. 8A-8E illustrate the programming and reading of the 4-state memory encoded with a conventional 2-bit Gray code. The memory cell's range of programmable threshold voltages (threshold window) is partitioned into four regions, representing an unprogrammed "U" state, and three other increasingly programmed states, "A", "B" and "C". The four regions are demarcated respectively by demarcation threshold voltages $D_A$, $D_B$ and $D_C$.

Figure 8A:
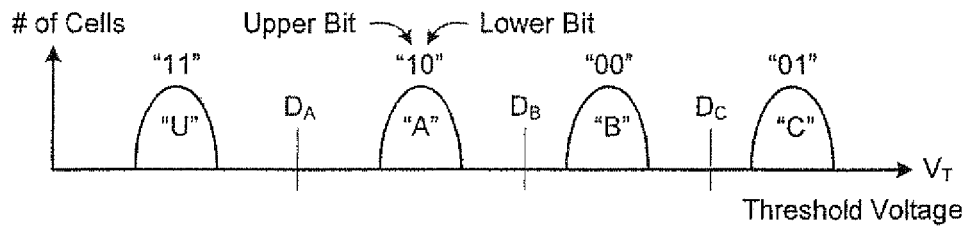
FIG. 8A illustrates threshold voltage distributions of the 4-state memory array when each memory cell stores two bits of data using a conventional Gray code.

FIG. 8A illustrates threshold voltage distributions of the 4-state memory array when each memory cell stores two bits of data using a conventional Gray code. The four distributions represent the population of cells) of the four memory states, "U", "A", "B" and "C". Before a memory cell is programmed, it is first erased into its "U" or "unprogrammed" state. The memory states "A", "B" and "C" are progressively reached as the memory cell get increasingly programmed. The Gray code uses the (Upper bit, Lower bit) to designate "U" as (1, 1), "A" as (1, 0), "B" as (0, 0) and "C" as (0, 1)

Figure 8B:
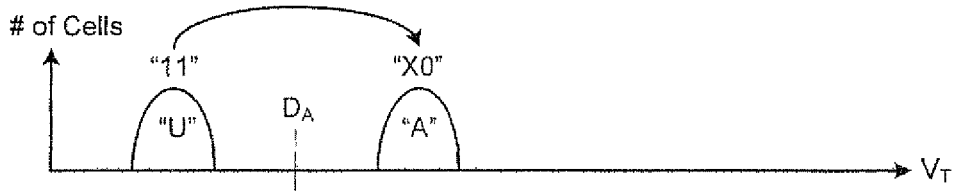
FIG. 8B illustrates the lower page programming in an existing, 2-pass programming scheme using the Gray code.

FIG. 8B illustrates the lower page programming in an existing, 2-pass programming scheme using the Gray code. For a page of cells to be programmed in parallel, the upper and low bits will give rise to two logical pages: a logical lower page consisting of the lower bits and a logical upper page consisting of the upper bits. A first programming pass only programs the logical lower page bits. By appropriate coding, a subsequent, second programming pass on the same page of cells will program the logical upper page bits without resetting the logical lower page bits. The Gray code is a commonly used code where only one bit changes when transiting to an adjacent state. Therefore, this code has the advantage of placing less demand on error correction since only one bit is involved.

A general scheme in using the Gray code is to let "1" represent a "not program" condition. Thus, the erased memory state "U" is represented by (Upper page bit, Lower page bit)=(1, 1). In a first pass to program the logical lower page, any cell to store the bit "0" will therefore have its logical state transit from (x, 1) to (x, 0), where "x" represent the "don't care" value of the upper bit. However, since the upper bit has not been programmed yet, "x" may as well be labeled by "1" for consistency. The (1, 0) logical state is represented by programming the cell to the memory state "A". That is, prior to a second program pass, the lower bit value of "0" is represented by the memory state "A".

Figure 8C:
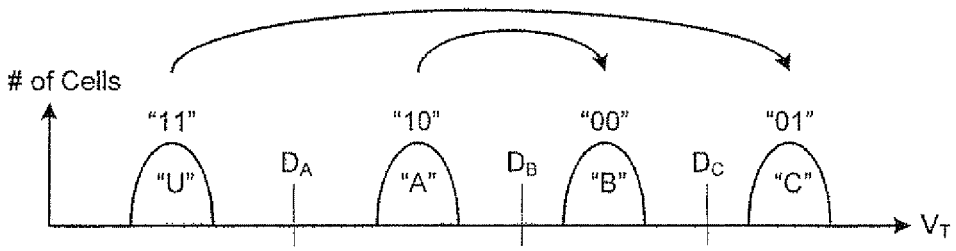
FIG. 8C illustrates the upper page programming in an existing, 2-pass programming scheme using the Gray code.
Figure 8D:
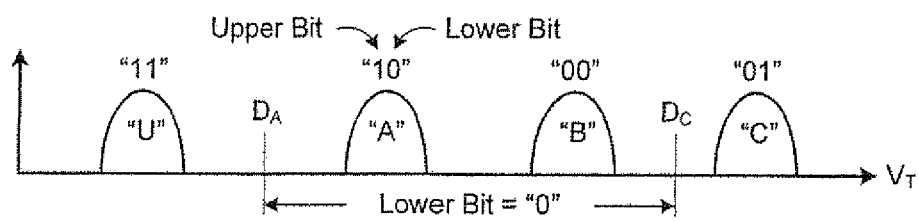
FIG. 8D illustrates the read operation that is required to discern the lower bit of the 4-state memory encoded with the Gray code.

As FIG. 8C illustrates the upper page programming in an existing, 2-pass programming scheme using the Gray code. A second pass programming is performed to store the bits of the logical upper page. Only those cells needing an upper page bit value of "0" will be programmed. After the first pass, the cells in the page are either in the logical state (1, 1) or (1, 0). In order to preserve the values of the lower page in the second pass, the lower bit value of "0" or "1" need be distinguished. For the transition from (1, 0) to (0, 0) the memory cell in question is programmed to the memory state "B". For the transition from (1, 1) to (0, 1) the memory cell in question is programmed to the memory state "C". In this way, during read, by determining the memory state programmed in a cell, both the lower page bit and the upper page bit can be decoded.

Programming is accomplished by alternately applying a programming pulse to a page of memory cells in parallel followed by sensing or program verifying on each of the cells to determine if any of them has been programmed to their target states. Whenever a cell has been program verified, it is locked out or program inhibited from further programming even as the programming pulses continue to be applied to complete the programming of the other cells in the group. It can be seen from FIGS. 8B and 8C that during the lower page programming, program verification need be performed relative to state "A" (denoted by "verifyA") with the demarcation threshold voltage $D_A$. However, for the upper page programming, program verification need be performed relative to states "B" and "C". Thus, the upper page verify will require a 2-pass verify of "verifyB and "verifyC", respectively relative to the demarcation threshold voltages $D_B$ and $D_C$.

FIG. 5D illustrates the read operation that is required to discern the lower bit of the 4-state memory encoded with the Gray code. Since the memory states "A" encoded by (1, 0) and "B" encoded by (0, 0) both have "0" as their lower bits, the lower bit "0" will be detected whenever a memory cell is programmed to either states "A" or "B". Conversely, the lower bit "1" will be detected whenever a memory cell is unprogrammed at state "U" or programmed to state "C". Thus, the lower page read will require a 2-pass read of readA and readC, respectively relative to the demarcation threshold voltages $D_A$ and $D_C$.

Figure 8E:
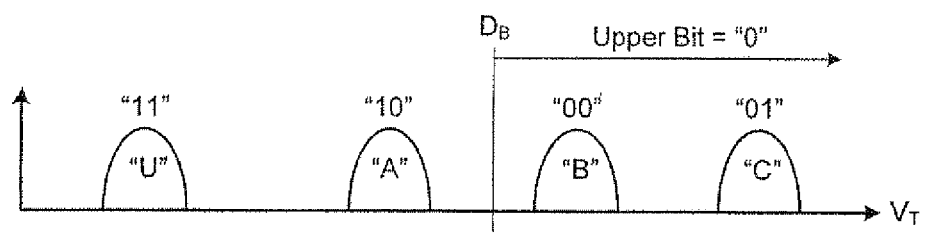
FIG. 8E illustrates the read operation that is required to discern the upper bit of the 4-state memory encoded with the Gray code.

FIG. 8E illustrates the read operation that is required to discern the upper bit of the 4-state memory encoded with the Gray code. It will require one read pass of readB relative to the demarcation threshold voltage $D_B$. In this way, any cells with programmed threshold voltages less than $D_B$ will be detected to be at memory state "1" and vice versa.

The Gray-code, 2-pass programming scheme can become a problem when the second-pass programming is erroneous. For example, the programming of the upper page bit to "0" while the lower bit is at "1" will cause the transition from (1, 1) to (0, 1). This requires the memory cell to be progressively programmed from "U" through "A" and "B" to "C". If there is a power outage before the completion of the programming, the memory cell may end up in one of the transition memory state, say "A". When the memory cell is read, "A" will be decoded as the logical state (1, 0). This gives incorrect results for both the upper and lower bits, since it should have been (0, 1). Similarly, if the programming is interrupted when "B" is reached, it would correspond to (0, 0). While the upper bit is now correct, the lower bit is still wrong. Furthermore, because, of the possible transition from the unprogrammed state "U" all the way to the most programmed state "C", this code scheme has the effect of exacerbating the potential differences between charge levels of adjacent cells programmed at different times. Thus, it also exacerbates the field-effect coupling ("Yupin Effect") between adjacent floating gates.

Figure 9A:
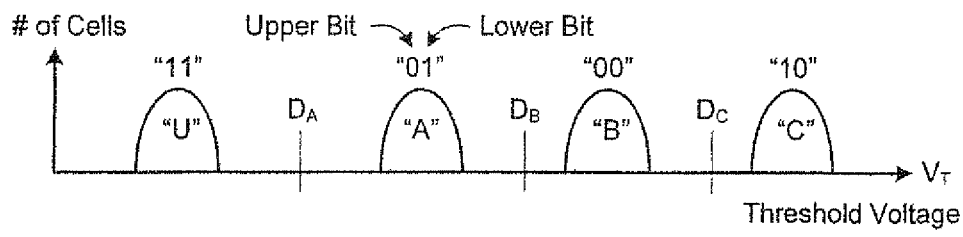
FIG. 9A illustrates threshold voltage distributions of the 4-state memory array when each memory cell stores two bits of data using the LM code.

FIGS. 9A-9E illustrate the programming and reading of the 4-state memory encoded with another logical code ("LM" code). This code provides more fault-tolerance and alleviates the neighboring cell coupling due to the Yupin Effect. FIG. 9A illustrates threshold voltage distributions of the 4-state memory array when each memory cell stores two bits of data using the LM code. The LM coding differs from the conventional Gray code shown in FIG. 8A in that the upper and lower bits are reversed for states "A" and "C". The "LM" code has been disclosed in U.S. Pat. No. 6,657,891 and is advantageous in reducing the field-effect coupling between adjacent floating gates by avoiding program operations that require a large change in charges.

Figure 9B:
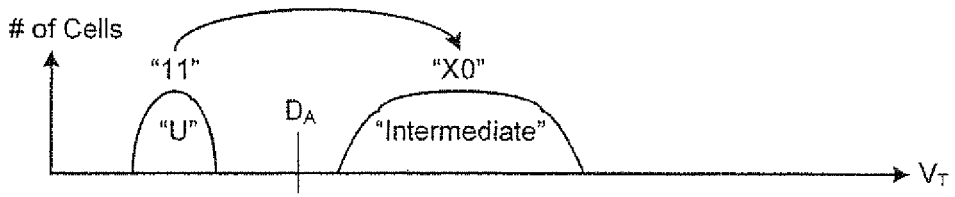
FIG. 9B illustrates the lower page programming in an existing, 2-pass programming scheme using the LM code.
Figure 9C:
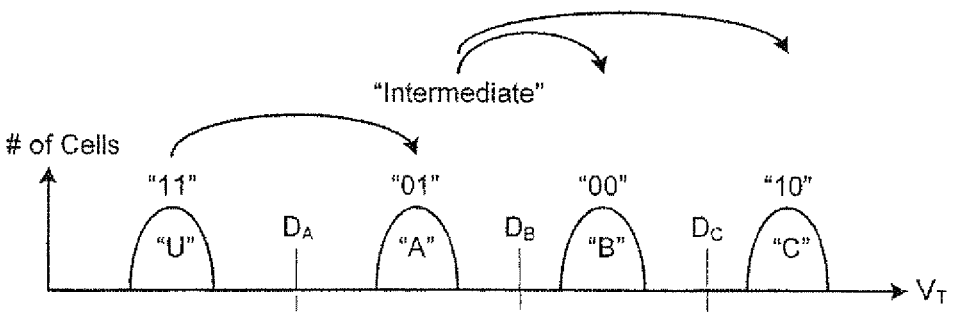
FIG. 9C illustrates the upper page programming in an existing, 2-pass programming scheme using the LM code.

FIG. 9B illustrates the lower page programming in an existing, 2-pass programming scheme using the LM code. The fault-tolerant LM code essentially avoids any upper page programming to transit through any intermediate states. Thus, the first pass lower page programming has the logical state (1, 1) transits to some intermediate state (x, 0) as represented by programming the "unprogrammed" memory state "U" to an "intermediate" state designated by (x, 0) with a programmed threshold voltage among a broad distribution that is greater than $D_A$ but less than $D_C$. FIG. 9C illustrates the upper page programming in an existing, 2-pass programming scheme using the LM code. In the second pass of programming the upper page bit to "0", if the lower page bit is at "1", the logical state (1, 1) transits to (0, 1) as represented by programming the "unprogrammed" memory state "U" to "A". If the lower page bit is at "0", the logical state (0, 0) is obtained by programming from the "intermediate" state to "B". Similarly, if the upper page is to remain at "1", while the lower page has been programmed to "0", it will require a transition from the "intermediate" state to (1, 0) as represented by programming the "intermediate" state to "C". Since the upper page programming only involves programming to the next adjacent memory state, no large amount of charges is altered from one pass to another. Furthermore a program abort does not change the lower page bit and is therefore more fault-tolerant.

Figure 9D:
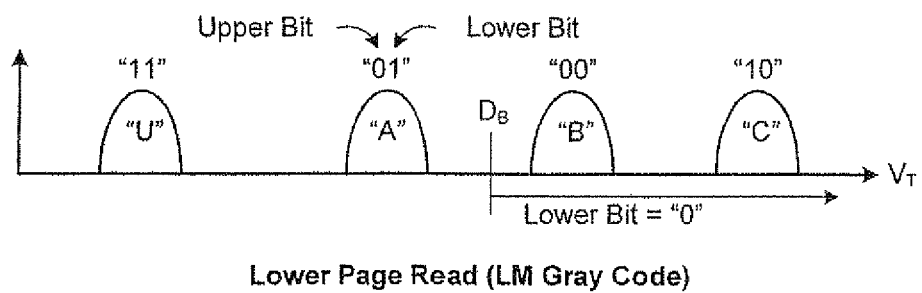
FIG. 9D illustrates the read operation that is required to discern the lower bit of the 4-state memory encoded with the LM code.

FIG. 9D illustrates the read operation that is required to discern the lower bit of the 4-state memory encoded with the LM code. The decoding will depend on whether the upper page has been programmed or not. If the upper page has been programmed, reading the lower page will require one read pass of readB relative to the demarcation threshold voltage $D_B$. On the other hand, if the upper page has not yet been programmed, the lower page is programmed to the "intermediate" state (FIG. 9B), and readB will cause error. Rather, reading the lower page will require one read pass of readA relative to the demarcation threshold voltage $D_A$. In order to distinguish the two cases, a flag ("LM" flag) is written in the upper page when the upper page is being programmed. During a read, it will first assume that the upper page has been programmed and therefore a readB operation will be performed. If the LM flag is read, then the assumption is correct and the read operation is done. On the other hand, if the first read did not yield a flag, it will indicate that the upper page has not been programmed and therefore the lower page would have to be read by a readA operation.

Figure 9E:
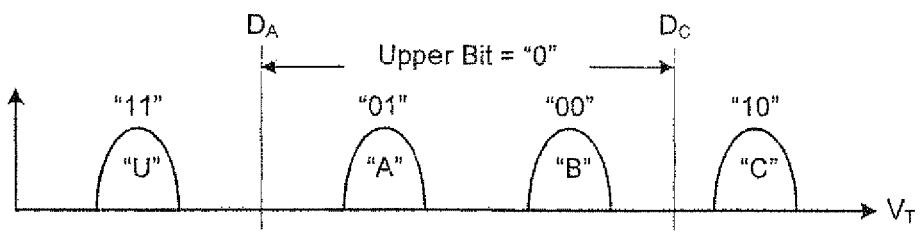
FIG. 9E illustrates the read operation that is required to discern the upper bit of the 4-state memory encoded with the LM code.

FIG. 9E illustrates the read operation that is required to discern the upper bit of the 4-state memory encoded with the LM code. As is clear from the figure, the upper page read will require a 2-pass read of readA and readC, respectively relative to the demarcation threshold voltages $D_A$ and $D_C$. Similarly, the decoding of upper page can also be confused by the "intermediate" state if the upper page is not yet programmed. Once again the LM flag will indicate whether the upper page has been programmed or not. If the upper page is not programmed, the read data will be reset to "1" indicating the upper page data is not programmed.

The LM code can also become a problem in a memory that supports partial page programming. While a page of memory cells are programmed or read in parallel, partial page programming allows a portion of the page to be programmed in one pass and the unprogrammed remaining portion to be programmed in a subsequent pass. The LM code presents a problem in a programming operation where an upper page is only partially filled with data. In a subsequent upper page programming to complete the partially unfilled page, the data may be programmed to the wrong states. By convention a "1" bit represents a "no program" condition and therefore both the lower and upper bits default to "1" initially in the unprogrammed "U" state. The upper page bit should be "1" representing cells in the unfilled portion. If the lower page bit for a cell in the unfilled portion happens to be "1", the resulting logical state (1, 1) will have the cell remain at "U". However, if the lower page bit is "0", it would result in the logical state (1, 0) which will cause the cell to be programmed to the most programmed (highest threshold voltage) "C" state. A subsequent programming pass to complete the unfilled portion can no longer entertain the possibility of getting to the (0, 0) or "B" state since it is not possible to roll back to a less programmed state from "C".

Figure 10A:
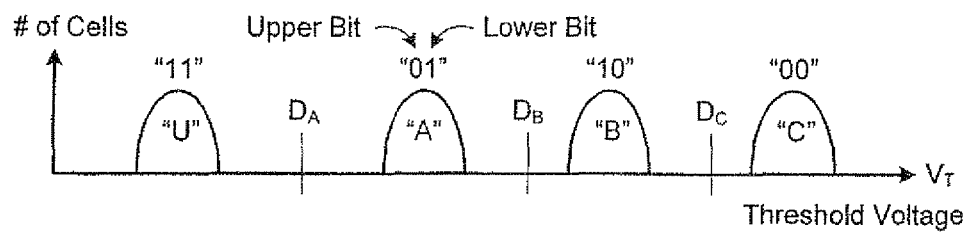
FIG. 10A illustrates threshold voltage distributions of the 4-state memory array when each memory cell stores two bits of data using the LM New code.

FIGS. 10A-10E illustrate the programming and reading of the 4-state memory encoded with a preferred, logical code ("LM New" code). The LM New code is similar to the LM code but without the disadvantages described above. FIG. 10A illustrates threshold voltage distributions of the 4-state memory array when each memory cell stores two bits of data using the LM New code. The LM New code has been disclosed in U.S. patent application Ser. No. 10/830,824 filed Apr. 24, 2004 by Li et al., entitled "NON-VOLATILE MEMORY AND CONTROL WITH IMPROVED PARTIAL PAGE PROGRAM CAPABILITY". The code differs from the LM code shown in FIG. 9A in that the logical coding for states "B" and "C" are interchanged. Thus the (Upper bit, Lower bit) for "U" is (1, 1), for "A" is (0, 1), for "B" is (1, 0) and for "C" is (0, 0). This coding avoids the problem of partial page programming in the LM code described above since the partially unfilled upper page is now programmed to the "B" state when the lower bit is at "0". Subsequent programming of the partially unfilled portion will allow programming from the (1, 0) to the (0, 0) logical state, which corresponds to programming from the "B" to the "C" state.

Figure 10B:
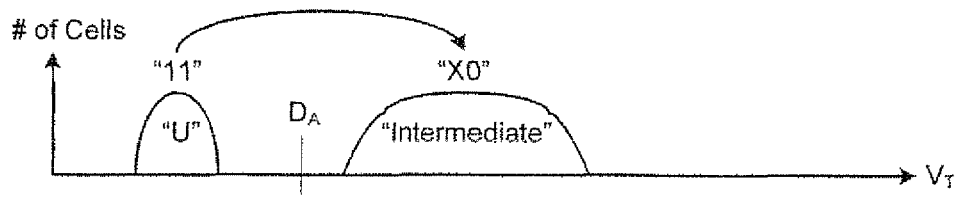
FIG. 10B illustrates the lower page programming in an existing, 2-pass programming scheme using the LM New code.
Figure 10C:
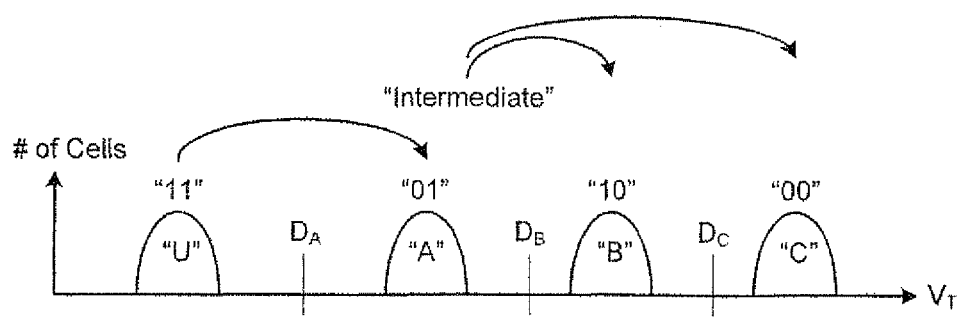
FIG. 10C illustrates the upper page programming in an existing, 2-pass programming scheme using the LM New code.

FIG. 10B illustrates the lower page programming in an existing, 2-pass programming scheme using the LM New code. The fault-tolerant LM New code essentially avoids any upper page programming to transit through any intermediate states. Thus, the first pass lower page programming has the logical state (1, 1) transits to some intermediate state (x, 0) as represented by programming the "unprogrammed" memory state "U" to the "intermediate" state designated by (x, 0) with a programmed threshold voltage greater than $D_A$ but less than $D_C$. FIG. 10C illustrates the upper page programming in an existing, 2-pass programming scheme using the LM New code. In the second pass of programming the upper page bit to "0", if the lower page bit is at "1", the logical state (1, 1) transits to (0, 1) as represented by programming the "unprogrammed" memory state "U" to "A". If the lower page bit is at "0", the logical state (0, 0) is obtained by programming from the "intermediate" state to "C". Similarly, if the upper page is to remain at "1", while the lower page has been programmed to "0", it will require a transition from the "intermediate" state to (1, 0) as represented by programming the "intermediate" state to "B".

Figure 10D:
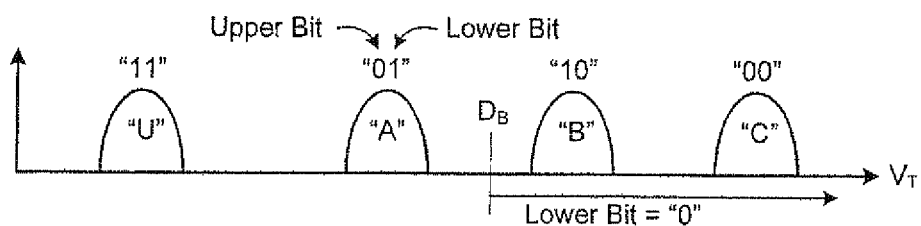
FIG. 10D illustrates the read operation that is required to discern the lower bit of the 4-state memory encoded with the LM New code.

FIG. 10D illustrates the read operation that is required to discern the lower bit of the 4-state memory encoded with the LM New code. The same consideration applies here as in the case for the LM code. A readB operation is first performed to determine if the LM flag can be read. If so, the upper page has been programmed and the readB operation will yield the lower page data correctly. On the other hand, if the upper page has not yet been programmed, the lower page data will be read by a readA operation.

Figure 10E:
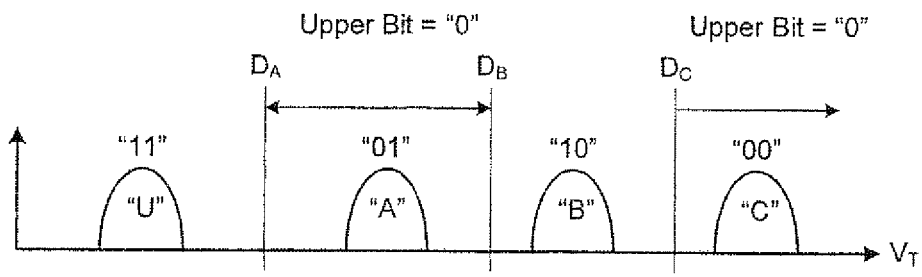
FIG. 10E illustrates the read operation that is required to discern the upper bit of the 4-state memory encoded with the LM New code.

FIG. 10E illustrates the read operation that is required to discern the upper bit of the 4-state memory encoded with the LM New code. As is clear from the figure, the upper page read will require a 3-pass read of readA, readB and readC, respectively relative to the demarcation threshold voltages $D_A$, $D_B$ and $D_C$. The decoding of the upper page has the same consideration described with regard to the LM flag for the LM code above.

The discussion of the various codes above for an example 4-state memory shows that a read operation can involve a single sensing pass as in "readB" which is comparing the programmed threshold voltage relative to the demarcation threshold voltage $D_B$. The readB operation is applicable for reading the upper page under the conventional Gray code or the lower page under the LM code or the lower page under the LM new code. In these cases of a single pass read, the read operation is completely agnostic as to the memory state of any of the cells in the page and therefore no cells irrelevant to the read operation could be identified beforehand to be turned off in order to save power.

A read operation can also involve a 2-pass read as in readA and readC in reading the lower page under the conventional Gray code or the upper page under the LM code. In this case, after the first pass, those memory cells with programmed threshold voltages less than the demarcation threshold voltage $D_A$ are detected. In the second pass of readC, memory cells previously detected under readA have their conduction currents turned off by grounding their bit lines so that they do not drain power unnecessarily.

A read operation can also involve a 3-pass read as in readA, readB and readC in reading the upper page under the LM New code. In this case, after the first pass, those memory cells with programmed threshold voltage less than the demarcation threshold voltage $D_A$ are detected. In the second pass of readB, the memory cells detected under readA have their conduction currents turned off by grounding their bit lines so that they do not unnecessarily drain the power. After the second pass, those memory cells with programmed threshold voltage less than the demarcation threshold voltage $D_B$ are detected. In the third pass of readC, the memory cells detected under readB also have their conduction currents turned off by grounding their bit lines, thereby further reducing any unnecessary drain in power.

Figure 11:
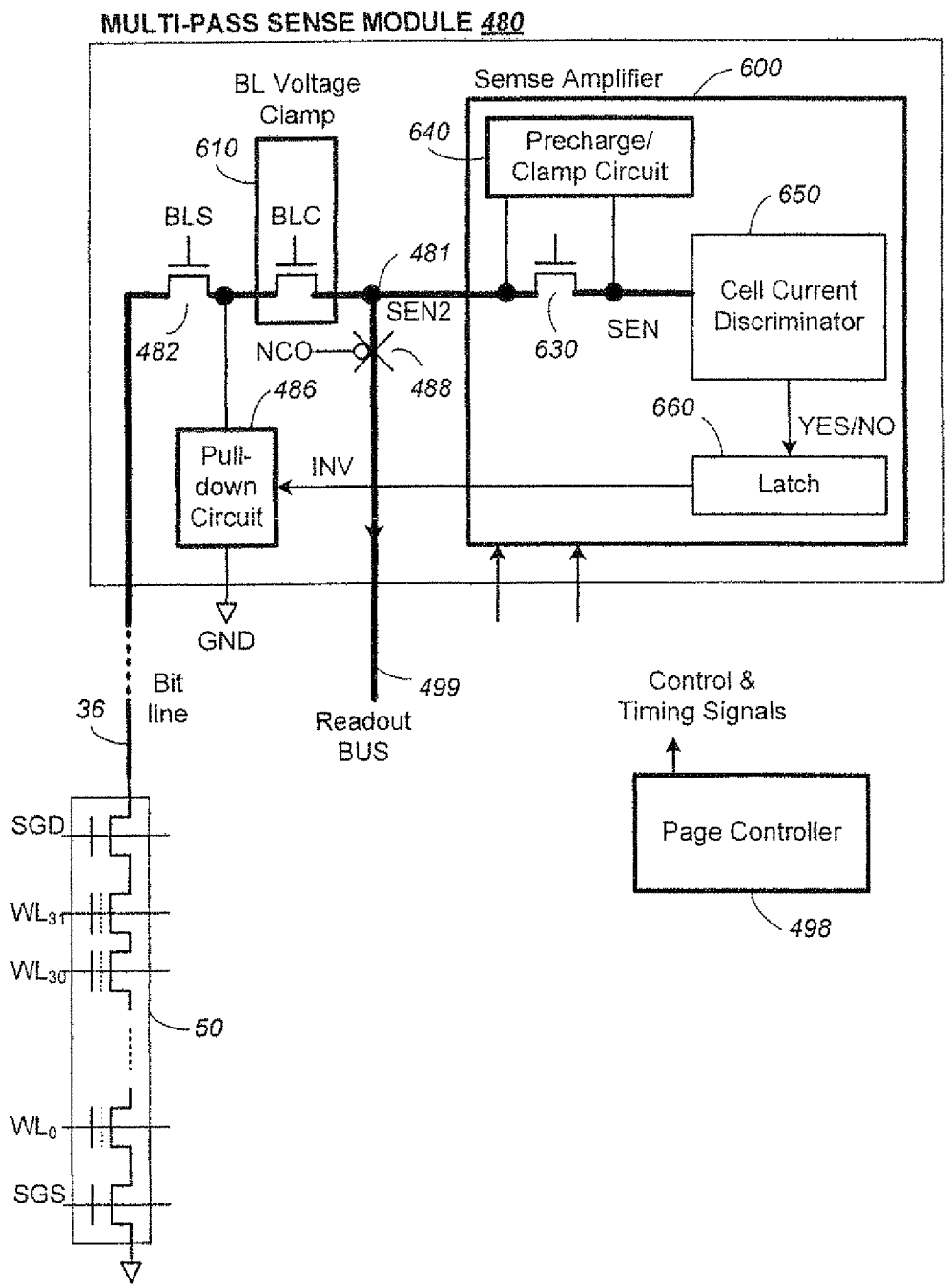
FIG. 11 illustrates schematically a preferred sense module with a sense amplifier suitable for practicing the invention.

FIG. 11 illustrates schematically in more details a preferred sense module shown in FIG. 6A that is suitable for practicing the invention. The sense module 480 senses the conduction current of a memory cell in a NAND chain 50 via a coupled bit line 36. It has a sense node 481 that can be selectively coupled to a bit line, a sense amplifier 600 or a readout bus 499. Initially, an isolation transistor 482, when enabled by a signal BLS connects the bit line 36 via a bit line voltage clamp 610 (controlled by a signal BLC) to the sense node 481. The sense amplifier 600 senses a signal SEN2 at the sense node 481. The sense amplifier includes a precharge/clamp circuit 640, a cell current discriminator 650 and a latch 660. In this example, the NAND chain 50 has thirty-two memory cells in series with their control gates connected to word lines $WL_0$-$WL_{31}$ respectively. The NAND chain 50 is coupled to ground via a select transistor controlled by a signal SGS and coupled to the bit line 36 via a select transistor controlled by a signal SGD.

The sense module 480 enables the conduction current of the selected memory cell in the NAND chain to be sensed. Prior to sensing, the voltages to the gates of the selected memory cell must be set via the appropriate word lines and bit line. As will be described in more detail later, the precharge operation starts with the unselected word line charging to a voltage Vread followed by charging the selected world line to a predetermined threshold voltage $V_T(i)$ for a given memory state under consideration. Then the precharged circuit 640 brings the bit line voltage to a predetermined drain voltage appropriate for sensing. This will induce a source-drain conduction current to flow in the selected memory cell in the NAND chain 50, which is detected from the channel of the NAND chain via a coupled bit line 36. The conduction current is a function of the charge programmed into the memory cell and the applied $V_T(i)$ when there exists a nominal voltage difference between the source and drain of the memory cell.

When the $V_T(i)$ voltage is stable, the conduction current or the programmed threshold voltage of the selected memory cell can be sensed via the coupled bit line 36. The sense amplifier 600 is then coupled to the sense node to sense the conduction current in the memory cell. The cell current discriminator 650 serves as a discriminator or comparator of current levels. It effectively determines whether the conduction current is higher or lower than a given demarcation current value $I_0(j)$. If it is higher, the latch 660 is set to a predetermined state with the signal INV=1.

A pull-down circuit 486 is activated in response to the latch 660 setting the signal INV to HIGH. This will pull down the sense node 481 and therefore the connected bit line 36 to ground voltage. This will inhibit the conduction current flow in the memory cell 10 irrespective of the control gate voltage since there will be no voltage difference between its source and drain.

In general, there will be a page of memory cells being operated on by a corresponding number of multi-pass sense modules 480. A page controller 498 supplies control and timing signals to each of the sense modules. The page controller 498 cycles each of the multi-pass sense module 480 through a predetermined number of passes (j=1 to N) and also supplies a predetermined demarcation current value $I_0(j)$ for each pass. As is well known in the arts, the demarcation current value can also be implemented as a demarcation threshold voltage, or time period for sensing. After the last pass, the page controller 498 enables a transfer gate 488 with a signal NCO to read the state of the sense node 481 as sensed data to a readout bus 499. In all, a page of sense data will be read out from all the multi-pass modules 480. Similar sense modules have been disclosed in U.S. patent application Ser. No. 11/015,199 filed Dec. 16, 2004 by Cernea et al., entitled "IMPROVED MEMORY SENSING CIRCUIT AND METHOD FOR LOW VOLTAGE OPERATION". The entire disclosure of U.S. patent application Ser. No. 11/015,199 is herein incorporated by reference.

Sequential Threshold Read with Progressive Turn Off

An example of performing the power-saving read shown in FIG. 7 is to perform a read operation with 3-pass sensing, successively relative to the demarcation threshold voltages $D_A$, $D_B$ and $D_C$. Such as a 3-pass read will have the sequence of readA, readB and readC as described in connection with reading the upper page under LM New code (FIG. 10E).

Figure 12:
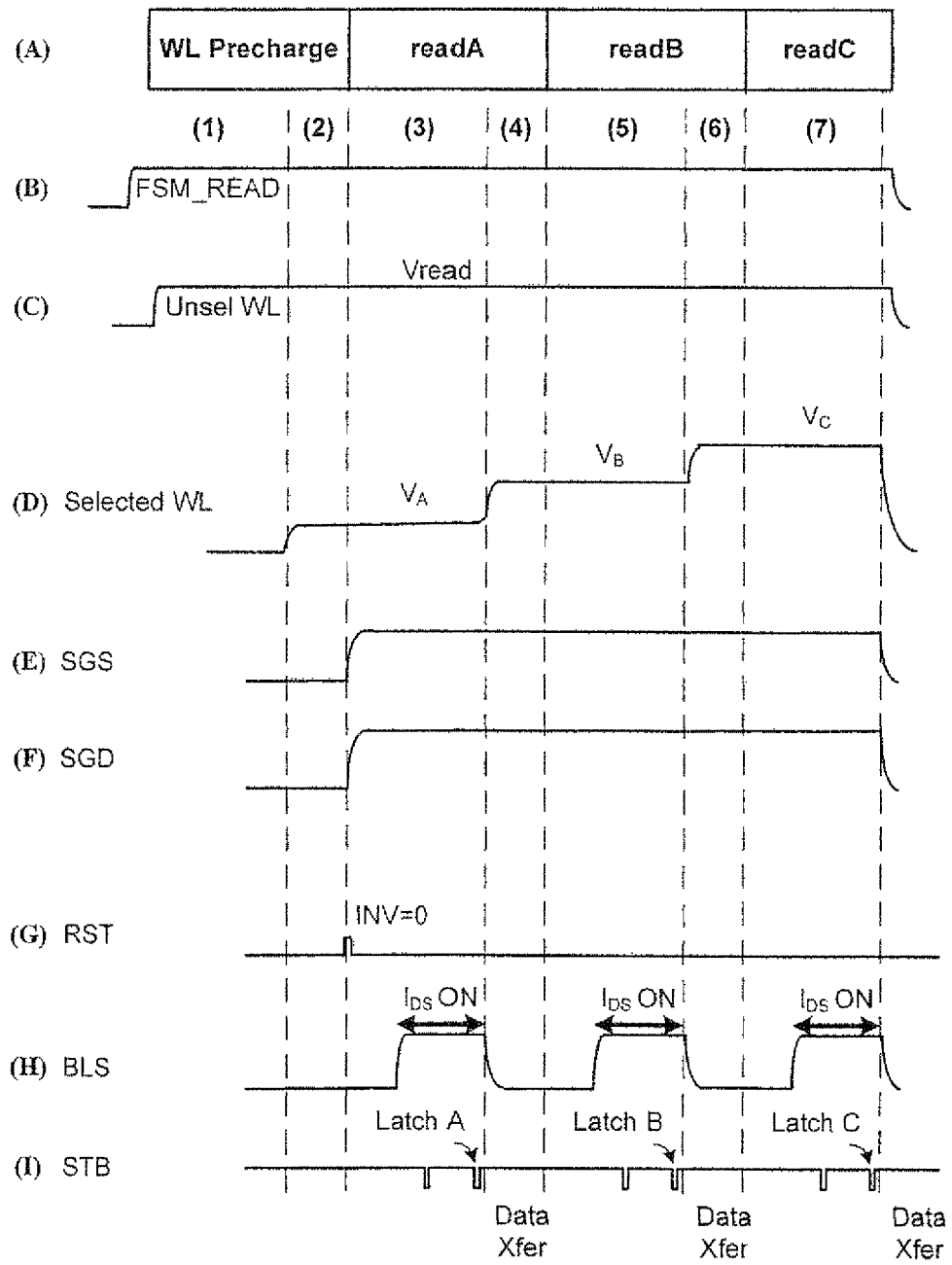
FIG. 12(A)-12(I) are timing diagrams that controls the operation of the sense module shown in FIG. 11 during the 3-pass read as applied to a NAND memory cell that is part of a memory page in parallel.

FIG. 12(A)-12(I) are timing diagrams that controls the operation of the sense module 480 shown in FIG. 11 during the 3-pass read as applied to a NAND memory cell that is part of a memory page in parallel. FIG. 12(A) shows the read operation to be divided into seven phases, with phases (1) and (2) grouped under a world line precharge suboperation, followed by phases (3) and (4) under readA, phases (5) and (6) under readB and phase (7) under readC suboperations respectively. FIG. 12(B) shows that the read operation is timed at the start and end by the FSM_READ signal rising and falling respectively.

The world line precharge suboperation begins at phase (1) with the unselected word lines of the NAND chain precharging with the rise of the Unsel WL signal as shown in FIG. 12(C). This supplies a voltage of Vread (e.g. 5.5V) to the control gates of the unselected cells in the NAND chain in order to turn them fully on. At phase (2), the selected word line of the NAND chain begins precharging with the rise of the Selected WL signal as shown in FIG. 12(D). This supplies a voltage $V_A$ (e.g. 0-0.6V) to the control gate of the selected cell in the NAND chain and effectively sets the demarcation threshold voltage $D_A$ in anticipation of the readA suboperation to follow.

The readA suboperation begins at phase (3) with the signal RST resetting the sense amplifier's output signal INV to zero (FIG. 12(G)). At the same time, the NAND chain is enabled for connection to the bit line by the signals SGS and SGD turning on a pair of select transistors of the NAND chain. The bit line is then coupled to the sense module by an enabling signal BLS (FIG. 12(H)). At that moment, the precharge/clamp circuit 640 in the sense module charges up the bit line to a predetermined voltage (e.g. 0.5V) against a draining conduction current, $I_{DS}$, of the memory cell (shown as "$I_{DS}$ ON" in FIG. 12(H)). As soon as the bit line voltage is stable, a strobe signal STB enables a latching of the result of the cell current discriminator 650 into the latch 660 (shown as "Latch A" or "Latch B" or "Latch C" in FIG. 12(I)). If the programmed threshold voltage of the memory cell is less than that of the demarcation threshold $D_A$, (or equivalently, the cell's conduction current is higher than a demarcation current) the node SEN or SEN2 will be drained down to LOW by the conduction current. This will result in a latch result with an INV signal at HIGH. Conversely, if the programmed threshold voltage of the memory cell is higher than DA, SEN2 will be detected to be HIGH and INV will be latched LOW. As soon as the data from the sense amplifier is latched, the signal BLS goes LOW, thereby disconnecting the memory cell from the sense module.

For those higher current memory cells where the sensing results in the signal INV being latched at HIGH, a pull-down circuit 486 pulls down their bit lines to ground. This effectively turns off the conduction currents and the power drain of those memory cells. In a preferred implementation, an additional earlier reading (see first strobe STB in phase (3) of FIG. 12(I)) is made by the sense amplifier with a limited bit line pull-up. This will identify those memory cells with even higher conduction current states and have their bit lines latched to ground as soon as possible in order to turn off their conduction currents.

In phase (4), the data in the SEN2 is transferred out via the readout bus 499 when the transfer gate 488 is enabled by the signal NCO. This is denoted by "Data Xfer" in FIG. 12.

The suboperations readB and readC are each similar to that of readA, with corresponding shifting of the selected WL voltage to $V_B$ and $V_C$ respectively.

For the consecutive sensing, it is preferably to sense progressive from the lower threshold voltage (such as from state "A"). This means the higher current cells are identified first for early disposal. If the cell has a programmed threshold voltage less than $D_A$, it is regarded as a conducting cell. The conducting cell will be discharged to ground after sensing at "A". This effectively turns off the conduction current in the cell. If the cell has a programmed threshold voltage higher than $D_A$, then it is regarded as non-conducting at "A" and the bit line will be kept at a constant value and not discharged. For the second suboperation of sensing at "B" level, only the bit lines of the non-conducting cells at "A" need be selectively charged up. This means that the sense module latches for the page are not reset to force INV back to zero (i.e., not reset to clear the bit line pulldown with INV=1). In this way, the cells which have a programmed threshold voltage less than $D_A$ will not be charged up, thereby saving power. It will be seen that with each successive sensing, more and more of the memory cell in the page are turned off as they are irrelevant to subsequent sensing. In this way, the power drained by the memory cells in the page is minimized.

While the example described refers to a read operation involving three demarcation threshold voltages, the methods and principle described are generally applicable to read operations with more than one pass where subsequent passes can take advantage of information obtained in an earlier pass to selectively turn off the cells irrelevant to the current pass. It should also be noted that in conventional implementations, the sensing relative to each memory state is independent of each other. That is, each sensing will go through exactly same number of steps, i.e., from phase (1) to phase (4) for each of readA, readB and readC. In the present sensing, only the first read pass, readA will reset all the sense amplifier's latches of the page to INV=0 in order to precharge all the bit lines in the page. Subsequent sensing will only charge up those bit lines with INV=0 while not charging those bit lines that have their INV's flipped during previous sensing.

Power-Saving Program Verify with Selective Turn Off

According to another aspect of the invention, when programming a page of memory cells over multiple passes, those memory cells of the page known to be irrelevant in a pass have their conduction currents turned off during a program verify operation to save power.

Figure 13:
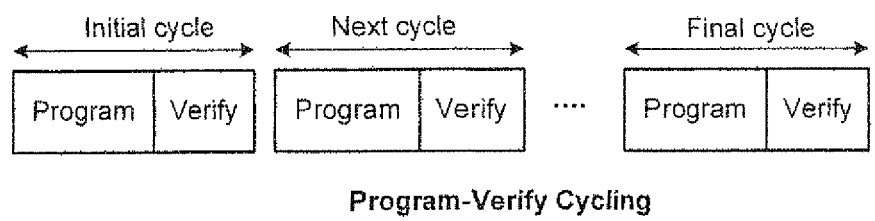
FIG. 13 illustrates a program operation with cycling alternately between a program phase and a program verify phase.

FIG. 13 illustrates a program operation with cycling alternately between a program phase and a program verify phase. The program phase comprises of setting appropriate voltages for the word lines and bit lines before applying a pulse of programming voltage to all the control gates of the memory cell in the page. The memory cells of the page are then sensed. If any of the cells has been verified to have reached its target state, it is locked out from further operations and the cell is inhibited from further programming. The program operation continues to cycle (such as "Initial cycle", "Next cycle", ..., "Final cycle")_through the "Program" and "Verify" phases until all cells in the page have been program verified.

The verify phase of a program operation determines the memory state of a memory cell by sensing the threshold voltage programmed in the cell after the latest programming pulse.

FIGS. 14(A)-14(E) are timing diagrams for the program phase of the program operation of FIG. 13. The program operation (FIG. 14(A)) is initiated by the signal FSM_PGM rising (FIG. 14(B)). At the same time, the bit lines have their voltages set. Those bit lines whose memory cells are to be programmed ("Program BL") will be set to 0V (FIG. 14(F)) while those bit lines whose memory cells are to be program inhibit ("Inhibit BL") will be set to Vdd (FIG. 14(E)). In the case of a NAND chain, the voltage on the unselected word lines ("unsel WL") is set to Vpass (FIG. 14(C)). This is followed by applying a pulse at Vpgm to the selected word line (FIG. 14(D)).

When the sensing is directed to program verification during a program operation, the system is cognizant of the target state to be programmed and therefore the state to be verified. In this case, turning off of irrelevant cells can also be applied during the first pass of the sensing. Only the pool of cells having the memory state currently being verified need have their bit lines charged up for sensing. Furthermore, during each program verify operation relative to a memory state, the pool of cells to be verified will progressively get smaller as more and more of cells are programmed verified. In another embodiment, the verified cells can also be excluded from further verification operations and have their bit lines excluded from subsequent precharge.

In one embodiment, power-saving is gained by simply ignoring those bits in the memory page that have been locked out from programming. Thus, during the verify phase, the bit lines associated with those memory cells known to be program-inhibited will not be precharged for sensing.

Figure 15:
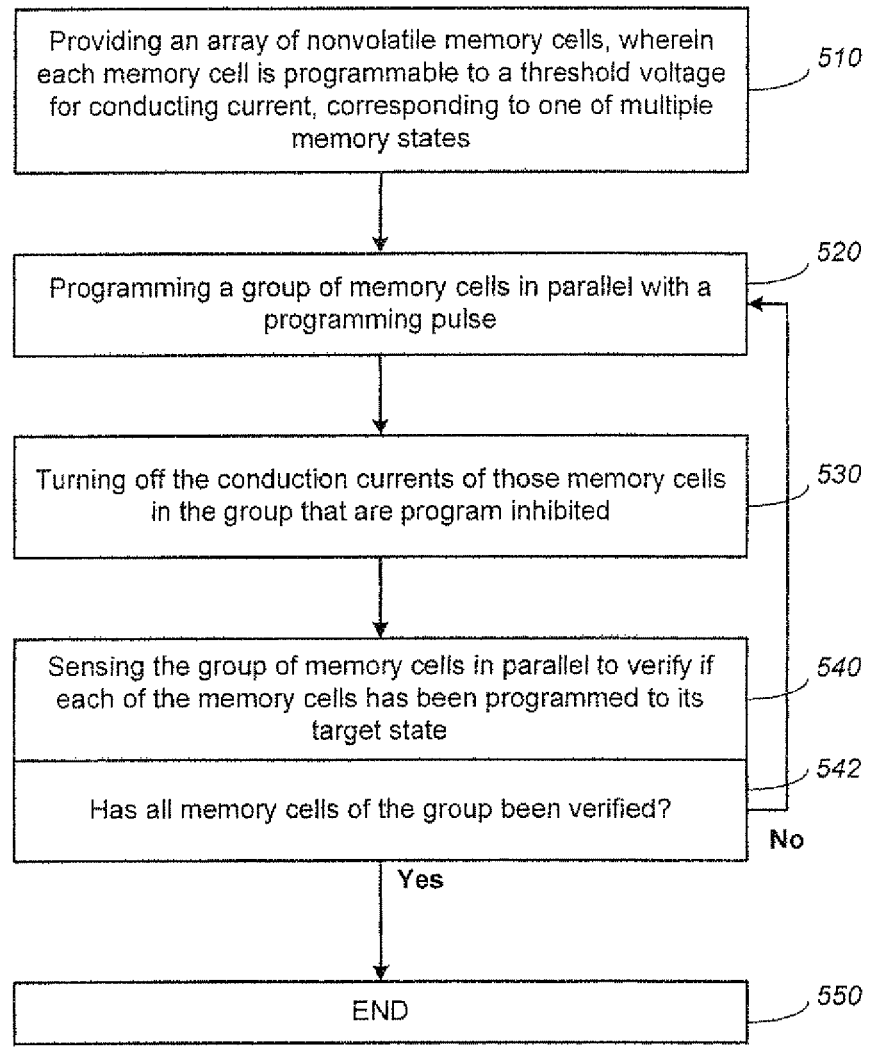
FIG. 15 is a flowchart for program operation incorporating a power-saving verify by ignoring the program-inhibited bits, according to a preferred embodiment of the invention.
Figure 16:
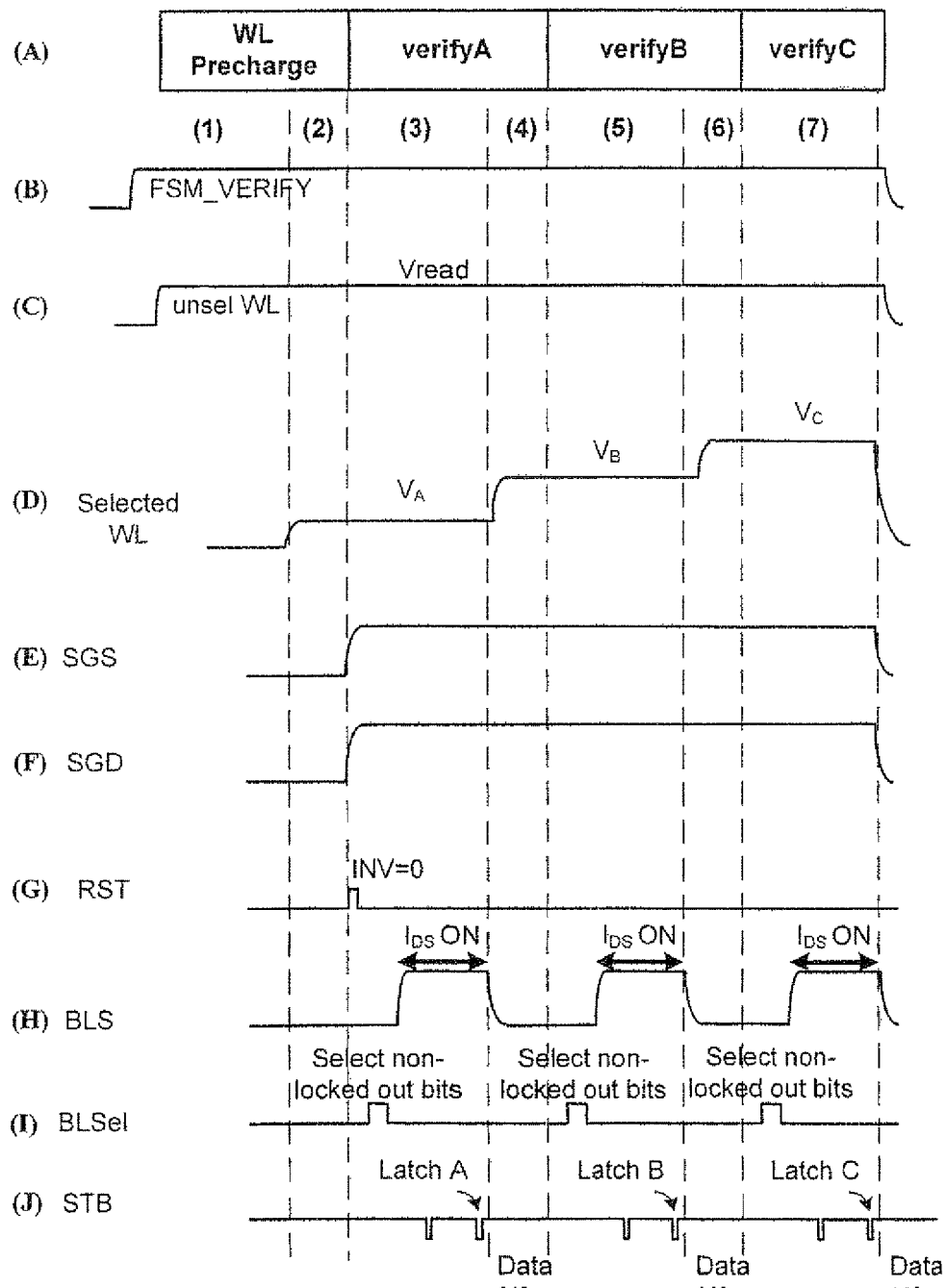
FIGS. 16(A)-16(J) are timing diagrams for the operation of the sense module shown in FIG. 11 during the verify phase of the program operation of FIG. 15.

FIG. 15 is a flowchart for program operation incorporating a power-saving verify by ignoring the program-inhibited bits, according to a preferred embodiment of the invention.

STEP 510: Providing an array of nonvolatile memory cells, wherein each memory cell is programmable to a threshold voltage for conducting current, corresponding to one of multiple memory states.

STEP 520: Programming a group of memory cells in parallel with a programming pulse.

STEP 530: Turning off the conduction currents of those memory cells in the group that are program inhibited.

STEP 540: Sensing in parallel the group of memory cells to verify if each of the memory cells have been programmed to its target memory state.

STEP 542: Has all memory cells of the group been verified? Otherwise proceed to STEP 520.

STEP 540: End.

FIGS. 16(A)-16(J) are timing diagrams for the operation of the sense module shown in FIG. 11 during the verify phase of the program operation of FIG. 15. The example shows a 3-pass sensing, verifyA, verifyB and verifyC relative to the memory states "A", "B" and "C" respectively. The timing signals and operations are similar to the 3-pass read operation shown in the timing diagrams of FIG. 12(A)-12(I). The main difference in the verify case is that at the beginning of each verify suboperation, the memory cells which are not program-inhibited or locked out will have their bit lines selected for precharged (with INV=0) (see FIG. 16 (I) where the signal BLSeI has the non-locked out bits selected) while the rest have their bit lines pulled down to ground (with INV=1).

In yet another embodiment, the step of turning off the conduction currents of the program inhibited cells is not performed at every verify phase, but only once during the first verify. The operation will be simplified with the tradeoff of less power-saving.

Figure 17:
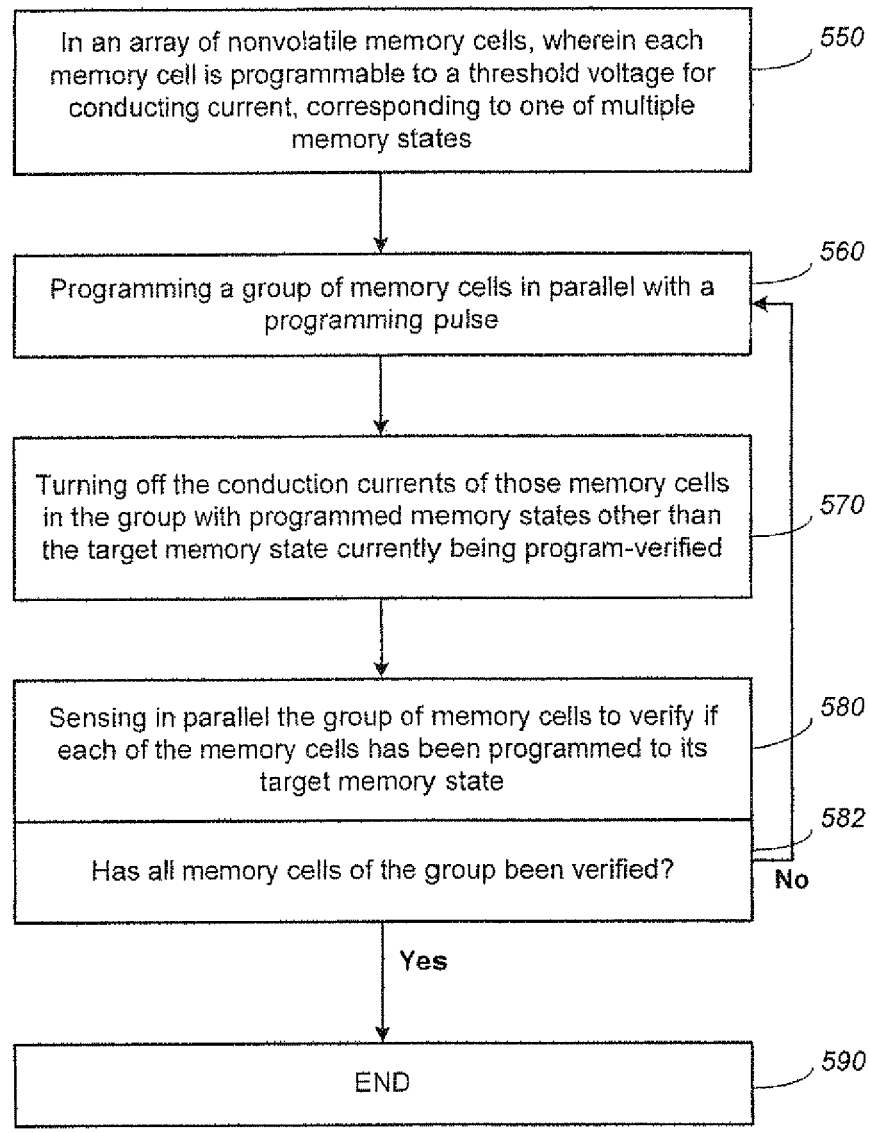
FIG. 17 is a flowchart for program operation incorporating a power-saving verify by selecting only the bits with a relevant memory state, according to a preferred embodiment of the invention.
Figure 18:
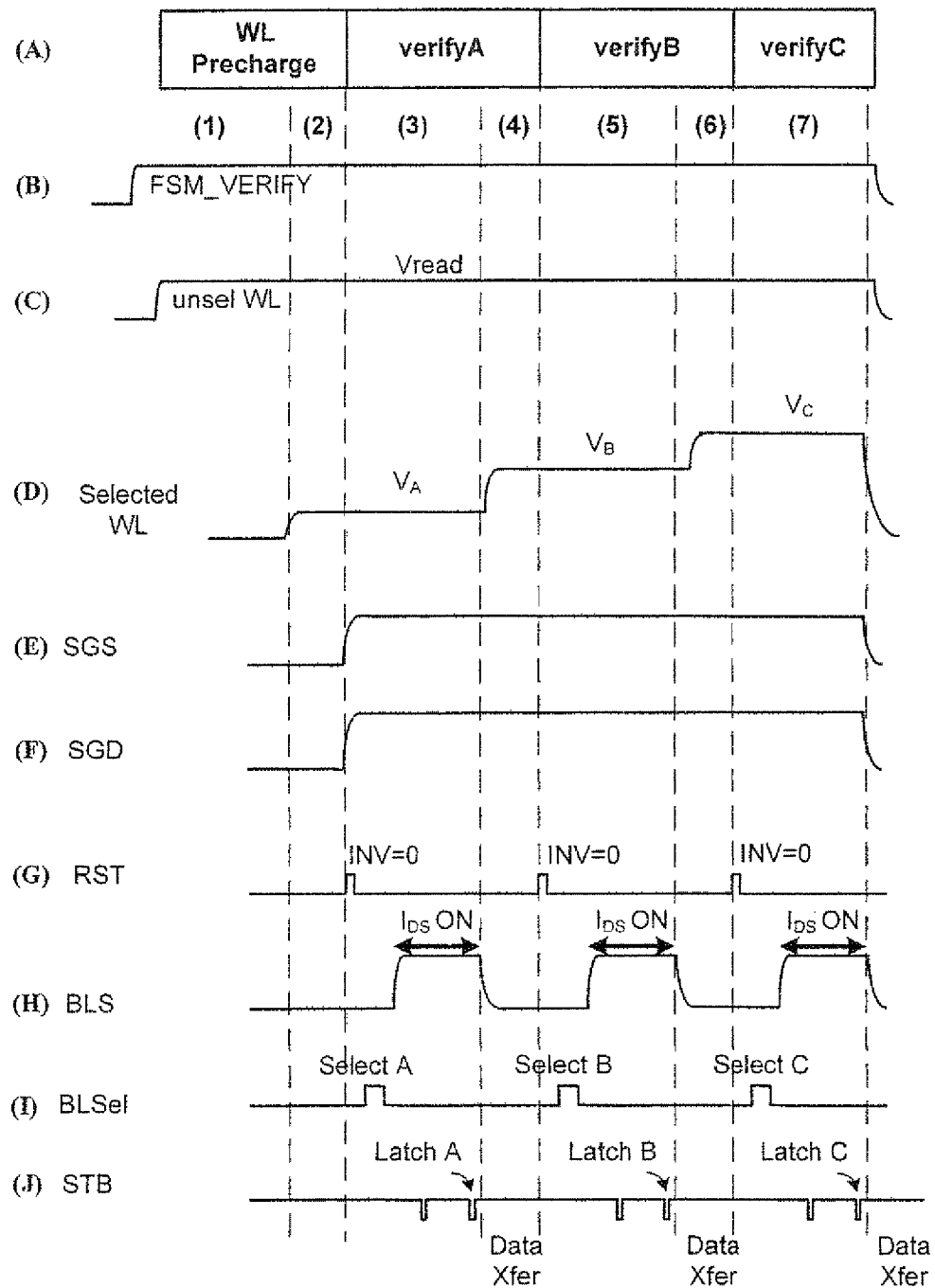
FIGS. 18(A)-18(J) are timing diagrams for the operation of the sense module shown in FIG. 11 during the verify phase of the program operation of FIG. 17.

FIG. 17 is a flowchart for program operation incorporating a power-saving verify by selecting only the bits with a relevant memory state, according to a preferred embodiment of the invention.

STEP 550: In an array of nonvolatile memory cells, wherein each memory cell is programmable to a threshold voltage for conducting current, corresponding to one of multiple memory states.

STEP 560: Programming a group of memory cells in parallel with a programming pulse.

STEP 570: Turning off the conduction currents of those memory cells in the group with programmed memory states other than the target memory state currently being program-verified.

STEP 580: Sensing in parallel the group of memory cells to verify if each of the memory cells have been programmed to the target memory state.

STEP 582: Has all memory cells of the group been verified? Otherwise proceed to STEP 560.

STEP 590: End.

FIGS. 18(A)-18(J) are timing diagrams for the operation of the sense module 480 shown in FIG. 11 during the verify phase of the program operation of FIG. 17. Again, the example shows similar timing signals as in FIG. 12 and FIG. 16 for a 3-pass sensing, verifyA, verifyB and verifyC relative to the memory states "A", "B" and "C" respectively. The timing and operations are similar to the 3-pass verify operation shown in the timing diagrams of FIG. 12(A)-12(J). The main difference in the memory-state-specific verify case is that at the beginning of each verify suboperation, the memory cells which are known to have a memory state current undergoing verification will have their bit lines selected for precharged (with INV=0) (see FIG. 18 (I)) while the rest have their bit lines pulled down to ground (with INV=1). Thus, during the suboperation verifyA, only the memory cells slated for state "A" are selected to have their bit lines precharged and sensed. Similarly, for verifyB and verifyC, only the memory cells respectively slated for state "B" and "C" are precharged and sensed. Furthermore, since different memory cells within the page with different memory states are selected during each verify suboperation, all bit lines within the page have their INV reset to zero before each selection (FIG. 18(G)).

Power-Saving by Shortening Precharge Period During Sensing

According to another aspect of the invention, during a sensing operation, a power-consuming period is minimized by preemptively starting any operations that prolongs the period. In the preferred embodiment, the operation for precharging unselected word lines of the memory array is preemptively started in a previous sensing cycle so that it does not prolong the current period of subjecting a selected bit line to precharging.

During a read operation, the turning on of the conduction current of a cell will drain power, especially when the current works against a precharge operation. The cell is turned on for a period of time starting from the precharge of the bit line until the conduction current has been measured. As can be seen from FIG. 12(H), this period is marked by the signal BLS HIGH.

Power is saved by minimizing the period the memory cells of the page are turned on, especially during the power-consuming bit line precharge operation. One factor affecting precharge duration is the need for all voltages on both the bit lines and the word lines to become stabilized. As the memory array becomes more highly integrated, the word line capacitance may increase to such an extent that it may take a substantially longer time to precharge than the bit lines. Since in convention sensing operation both bit line and word line precharging are initiated at the start of the sensing cycle, the power-consuming bit line precharging will need to be extended simply to accommodate a slower word line precharging. The invention prescribes starting the word line precharging before the current sensing cycle so as to give it a head start and not prolong the bit line precharging unnecessarily. This is accomplished by jump-starting the word line precharging in an earlier adjacent cycle. In a preferred embodiment, the word line precharging is started in an earlier adjacent sensing cycle, during the period when the sense module is exchanging data with the outside.

Figure 19:
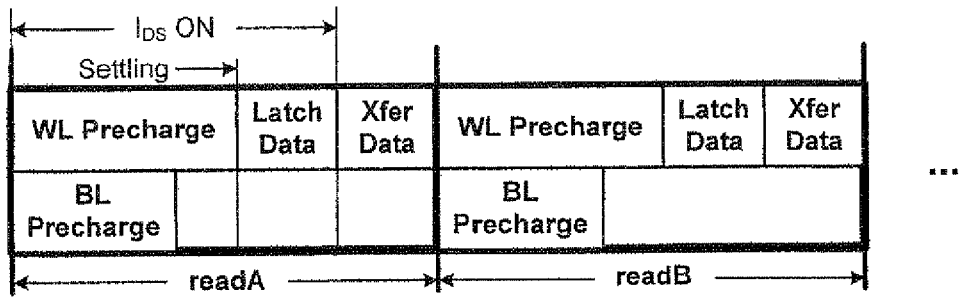
FIG. 19 illustrates a conventional timing for the precharge of the bit lines and the word lines.

FIG. 19 illustrates a conventional timing for the precharge of the bit lines and the word lines. For convenience, the sensing involves only readA and readB, where conventionally are treated as two independent sensing cycles. It will be seen that in each cycle, the overall precharge period ("Settling") for the bit lines ("BL Precharge") or word lines ("WL Precharge") to stabilize and is determined by the slower of the two. Only after the voltages have stabilized can the data be latched correctly. The precharge will be turned off during the data latch ("Latch Data") phase and is not required in the data transfer ("Xfer Data") phase. Conventionally for expediency, the precharge of the word lines is started at the same time as the precharge of the bit line. If the word line precharge takes longer to settle, the bit line precharge period, may be prolonged unnecessarily, resulting in more power consumption (i.e., a prolonged period of $I_{DS}$ ON). Furthermore, the word line precharge is repeated at every independent sensing cycle, which in the example would be present in both readA and readB cycles.

Figure 20:
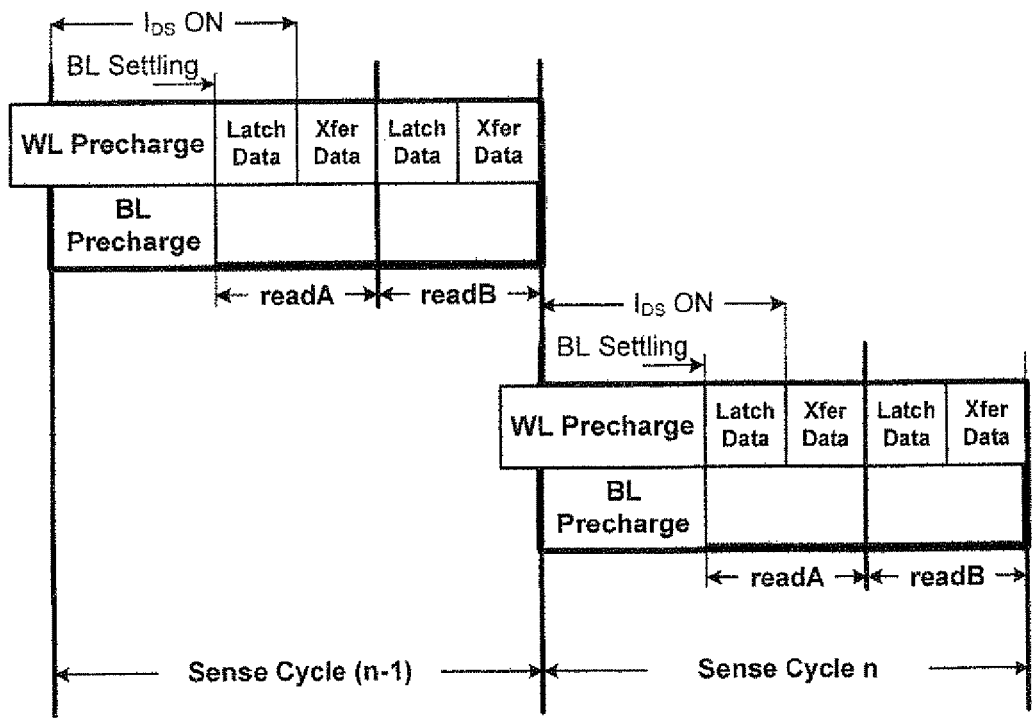
FIG. 20 illustrates a preferred scheme for jump-starting the word line precharge in a sensing operation.

FIG. 20 illustrates a preferred scheme for jump-starting the word line precharge in a sensing operation. The reference characters are similar to that in FIG. 19. Two sense cycles, Sense Cycle (n−1) and Sense Cycle n are shown, each comprising readA and readB subcycles. Essentially, when the period for word line precharge (WL Precharge) is longer than that of bit line precharge (BL Precharge), the word lines are preemptively precharged (WL Precharge) at an earlier sense cycle. In the precharged operation, the selected bit line typically rises by about 0.5V, the unselected word lines by about 5.5V and the selected word line by about 1V. Since the unselected word lines have to be increased by 5.5V, the time for them to get there will become longer as the word line capacitance increases with increasing page size. Before latching of the sense result can take place, the VT(i) on the selected word line must be stable, which, due to coupling effect, is predicated on a reasonably stable voltage on the unselected word lines. Expediently, the jump-start on precharging the unselected word lines can take place during the data transfer phase of the previous sensing cycle. In this way, at least some of the delays caused by a longer word line precharge period can be reduced if not eliminated altogether and the overall precharge period will then be determined by the time for the bit line precharge to become stable (shown as "BL Settling").

According to yet another aspect of the invention, the unselected word line precharge is only performed at the beginning of a sensing operation comprising multiple passes of sensing cycles relative to multiple threshold voltages.

The present scheme of implementing a multi-pass sensing operation only requires the unselected word lines to be precharged at the beginning of the operation and not repeated after every passing cycle or suboperation, such as readA. In this way, the bit line precharging period is kept to a minimum to save power.

Power-Saving During Program Cycle by Minimizing Precharging of Program Inhibited Bit Lines In the case of programming a NAND memory, a programming voltage pulse is applied to the word line connecting to the page of selected memory cells. Within the page, those memory cells that are to be programmed have their bit line voltage set to 0V (FIG. 14(E)) while the other memory cells not to be programmed have their bit line voltage to Vdd (FIG. 14(F)) in order to inhibit programming. Setting the bit line to Vdd will effectively turn off the select transistor at the drain side of the NAND chain and result in a floated channel. During programming the voltage at the floated channel will be boosted by the high word line voltages. This will effectively reduce the potential difference between the channel and the charge storage unit, thereby discouraging pulling electrons from the channel to the charge storage unit to effect programming.

Figure 14:
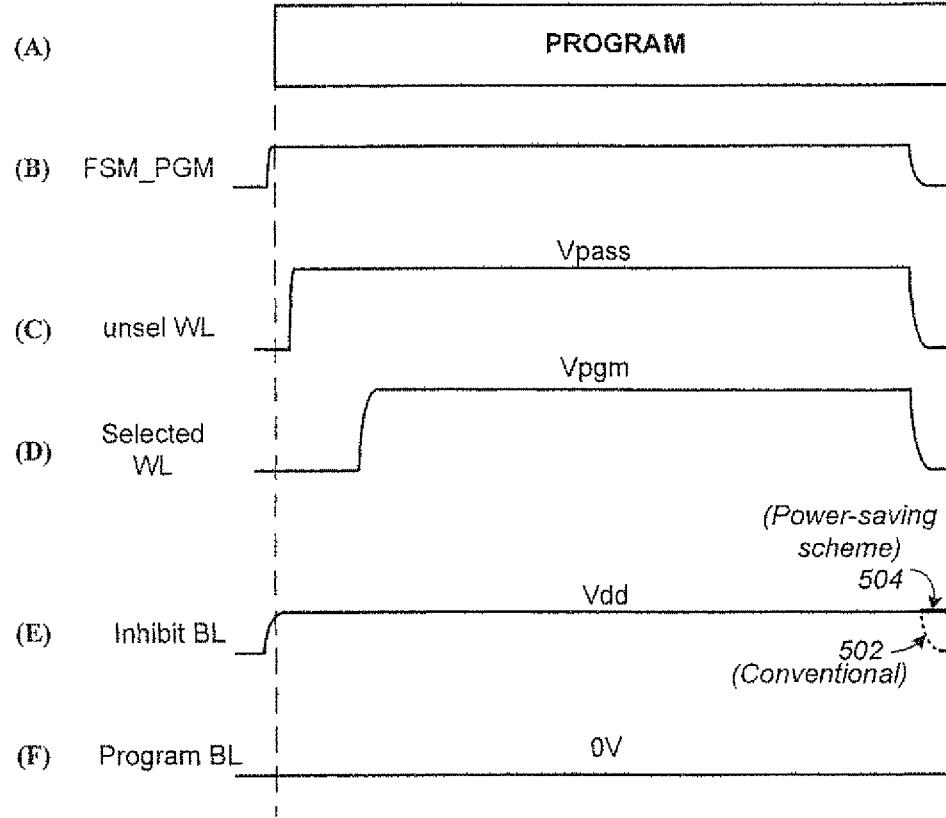
FIGS. 14(A)-14(F) are timing diagrams for the program phase of the program operation of FIG. 13.

FIG. 14(E) illustrates the timing of charging and discharging a bit line whose memory cell is being program inhibited. Conventionally, the bit line with the inhibited cell is charged up to Vdd at the beginning of the program cycle and discharged to 0V at the end of the program pulse as shown by the falling edge 502. The bit line is discharged so that it is ready for the verify phase of the program-verify cycling. The alternate charging and discharging of the program inhibited bit lines are power consuming.

According to another aspect of the invention, in a program operation having cycles of alternate program and verify phases, a method of programming (with power-saving feature) comprising charging up the bit lines of memory cells that are program inhibited to a predetermined voltage while not charging up the bit lines of memory cells that are to be programmed at the beginning of the program phase; and discharging the bit lines of memory cells that are to be programmed while not discharging the bit lines of the memory cells that are program inhibited at the end of the program phase (see edge 504 "Power-saving scheme" in FIG. 14(E).)

Figure 21:
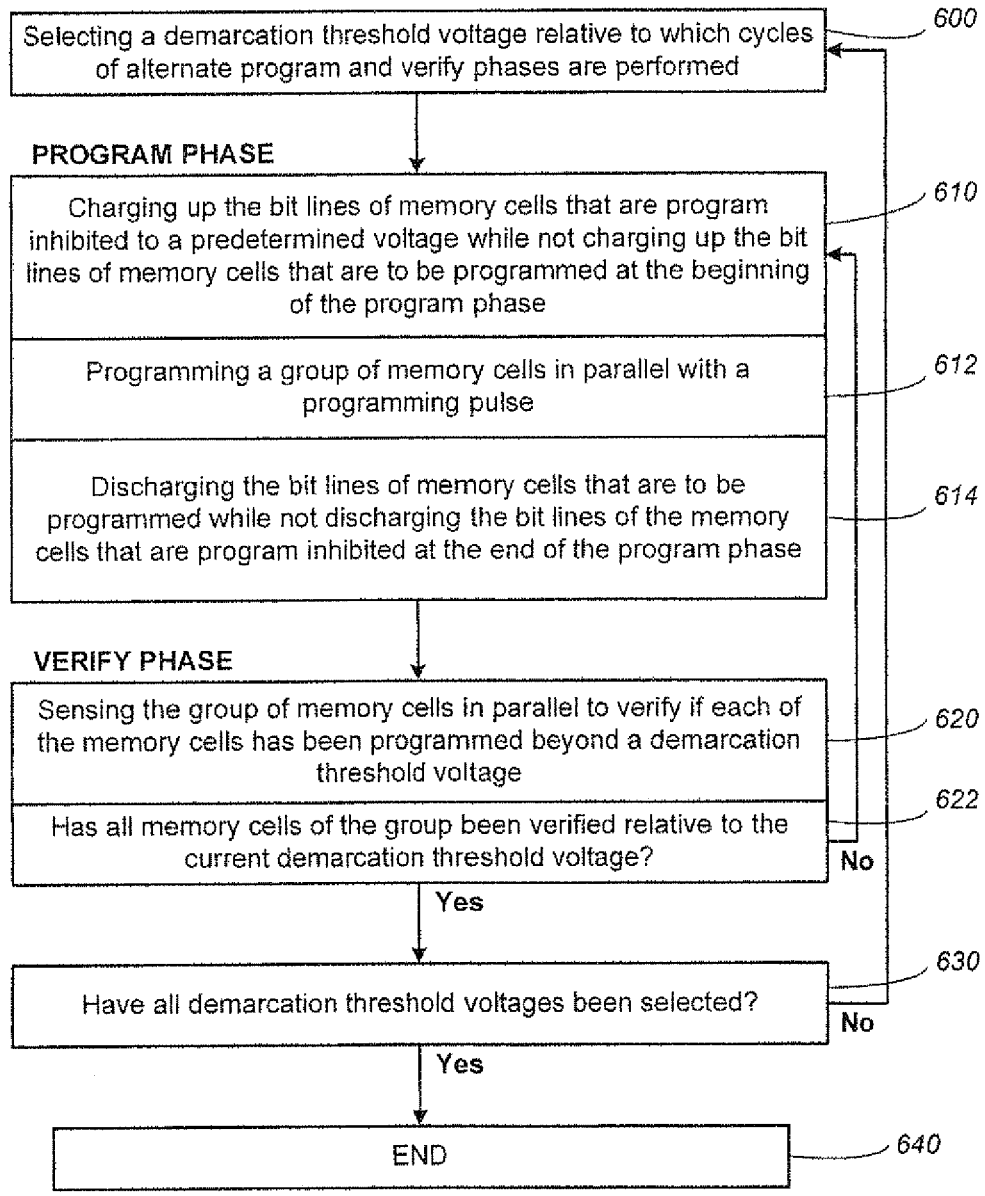
FIG. 21 is a flowchart for programming a group of memory cells in parallel, incorporating the power-saving program-inhibit technique.

FIG. 21 is a flowchart for programming a group of memory cells in parallel, incorporating the power-saving program-inhibit technique.

STEP 600: Selecting a demarcation threshold voltage relative to which cycles of alternate program and verify phases are performed.

Program Phase

STEP 610: Charging up the bit lines of memory cells that are program inhibited to a predetermined voltage while not charging up the bit lines of memory cells that are to be programmed at the beginning of the program phase.

STEP 612: Programming a group of memory cells in parallel with a programming pulse.

STEP 614: Discharging the bit lines of memory cells that are to be programmed while not discharging the bit lines of the memory cells that are program inhibited at the end of the program phase.

Verify Phase

STEP 620: Sensing the group of memory cells in parallel to verify if each of the memory cells has been programmed beyond a demarcation threshold voltage.

STEP 622: Has all memory cells of the group been verified relative to the current demarcation threshold voltage? Otherwise proceed to STEP 610.

STEP 630: Have all demarcation threshold voltages been selected? Otherwise proceed to STEP 600.

STEP 640: End.

In one embodiment, at least a subset of the undischarged bit lines will retain it voltage when passing between alternate program and verify phases, thereby eliminating the power-consuming charging and discharging of those bit lines in every program phase. The subset of the undischarged bit line corresponds to memory cells that have been verified relative to a current demarcation threshold voltage.

For example in programming a page of memory cells, the data will require some cells to be programmed to a threshold voltage greater than a demarcation threshold voltage $D_A$ ("Group PROGRAM" cells) while other cells will not be programmed ("Group LOCKOUT" cells) having a threshold voltage less than $D_A$. Initially, Group LOCKOUT will be constituted from cells that are dictated by data to be unprogrammed. In the first program phase, Group PROGRAM cells will have their bit lines at 0V while Group LOCKOUT cells will have their bit lines charged up to Vdd to effect program inhibition. In the next verfyA phase, the state of Group LOCKOUT cells is known and need not be sensed. Group PROGRAM cells have their bit lines charged up to at least 0.5V for sensing. The sense result will distinguish two subgroups from Group PROGRAM. One subgroup ("Subgroup NOTVERIFIED") is for cells that have not yet been programmed past $D_A$ while the other subgroup ("Subgroup VERIFIED") is for cells that have already been programmed past $D_A$. In the next pass of program phase, subgroup NOTVERIFIED will become Group PROGRAM while Subgroup VERIFIED will be added to group LOCKOUT.

It is desirable to maintain the bit line voltage high (e.g. Vdd) for group LOCKOUT throughout successive passes of program and verify phases so that the bit lines will not consume power by having to repeatedly undergoing charging and discharging. However, during the verify phase, the NOTVERIFIED cells which have thresholds less than the demarcation threshold voltage will necessarily be conducting, resulting in discharging of their bit lines. This also applies to those cells locked out when verified against a previous demarcation threshold voltage (e.g., for the first verify phase, it will be the unprogrammed cells) since they were "verified" relative to a previous, lower demarcation threshold voltage and therefore will be conducting relative to the current, higher demarcation threshold voltage.

In the next pass of a program phase, the bit line voltage for the group PROGRAM will again be set to zero while that of group LOCKOUT will be set to Vdd. As explained above, many of the more conducting cells in group LOCKOUT will have been discharged by the conducting cells in the previous verify phase. So these cells will have to be charged up to Vdd again. The cells that were just verified with respect to the current demarcation threshold voltage started out in group PROGRAM where their bit line voltage is low. These cells will join the ranks of group LOCKOUT, resulting in their bit line being charged up the Vdd.

In the next verify phase with respect to the same demarcation threshold voltage, the previously verified cells enter the phase undischarged at Vdd and will remain so since they are, by definition, non-conducting relative to the current demarcation threshold voltage. These verified cells will enter into the next program phase substantially at Vdd already, thereby saving the power to charge them.

Thus, the previously verified cells with respect to the current demarcation threshold voltage will form a power-saving subgroup among group LOCKOUT that do not require power consuming charging at the beginning of each program phase. As more and more of the cells initially in group PROGRAM become verified they will relocate to the power-saving subgroup and more and more power-saving will result until all cells initially in group PROGRAM have been programmed properly with respect to the given demarcation threshold voltage.

Similarly, if the program and verify operation is with respect to more than one demarcation threshold voltages, the same considerations apply where no saving is reaped from lockout cells verified relative to a previous demarcation threshold voltage, but there will be power-saving from those verified relative to a current demarcation threshold voltage when there are multiple cycles involved. For example, the invention will reap benefit in a program/verify operation that may include three cycles of program/VerifyA, six cycles of program/verifyA/B, four cycles of program/verifyA/B/C, six cycles of program/verifyB/C and 3 cycles of program/verifyC.

In the program/verifyA cycle, the program inhibited cells will have their bit lines charged up to Vdd in the program phase, and are not discharged at the end of the phase. During the verifyA phase, the bit line of the unprogrammed cells will be discharge by the conducting cells. However the bit lines associated with group VERIFIED will not be discharged. These will remain at Vdd and need not be re-charged at the next pass of the program phase. In the program/verifyA/B cycles, similarly, during the verifyA/B phase, the bit lines of the unprogrammed and "A"-verified cells will discharge by the conducting cells while the B-verified cells will not and need not be re-charged at the next pass of the program phase. Similarly, in the program/verifyA/B/C cycles, the power saving will be on the "C"-verified cells. In the program/verifyB/C cycles, the power saving will be on the "C"-verified cells. In the program/verifyC cycle, the power saving will be on the "C"-verified cells. It has been estimated for a random data pattern, that the power saving is about 25%.

It is even more desirable if power-saving can also be reaped from lockout cells verified relative to a previous demarcation threshold voltage.

In another embodiment, all the undischarged bit lines will retain it voltage when cycling between alternate program and verify phases, thereby eliminating the power-consuming charging and discharging of those bit lines in every program phase.

Generally, in a verify phase, those memory cells with threshold voltages less the current demarcation threshold voltage (i.e., the ones that has been lockout of further programming based on a previous, lower demarcation threshold voltage) will be conducting. This means that the lockout bit lines will be discharged by the cell current and will necessitate re-charging at the beginning of the next program phase to effect program inhibition.

The invention is accomplished by preventing the lockout bit lines to be discharged by their conducting cells. A switch is provided between each memory cell or NAND chain and its associated bit line. The switch is responsive to a voltage condition on its associated bit line to connect the memory cell or NAND chain to its associated bit line when the bit line is substantially at zero voltage and to disconnect the memory cell or NAND chain from its associated bit line when the bit line is substantially at a supply voltage.

Figure 22:
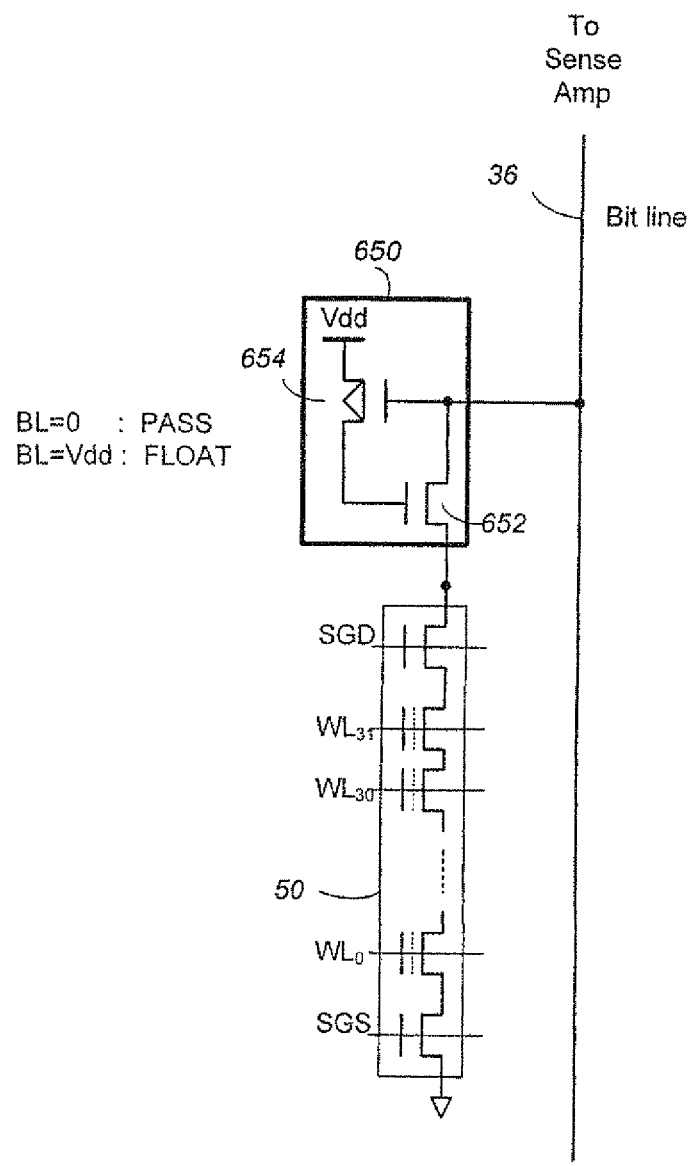
FIG. 22 illustrates one embodiment of the memory to bit line switch.

FIG. 22 illustrates one embodiment of the memory to bit line switch. A switch 650 is provided between a NAND chain 50 and its associated bit line 36. The NAND chain 50 is similar and has the same reference characters as that shown in FIG. 11. The switch 650 includes an n-channel transistor 652 with its source and drain connected in series between the NAND chain 50 and the bit line 36 respectively. The n-channel transistor 652 is turned on or off by a signal at its control gate. The signal is provided by a supply voltage Vdd via a p-channel transistor 654 with its source and drain connected in series between the control gate of the n-channel transistor 652 and the supply voltage. The p-channel transistor 654 has its control gate connected to sense the voltage on the bit line.

In operation, when the bit line voltage is LOW, the p-channel transistor 654 is turned on. That results in the n-channel transistor 602 being turned on by virtue of Vdd appearing on its control gate. That in turn results in the switch 650 connecting the NAND chain 50 to the bit line 36. Conversely, when the bit line voltage is HIGH (e.g., Vdd), the p-channel transistor 654 is turned off and so is the n-channel transistor 652. Thus, the switch disconnects the NAND chain 50 from the bit line 36.

Thus, when operating with the memory to bit-line switch, the invention will allow the program inhibited bit line to be charged up to Vdd and not be discharged at the end of the program phase. At the same time the switch will prevent any conducting memory cell from discharging these bit lines. In this way, the program inhibited bit lines can avoid repeated charging and discharging during the program/verify cycling.

Although the various aspects of the present invention have been described with respect to certain embodiments, it is understood that the invention is entitled to protection within the full scope of the appended claims.

What is claimed is:

1. In an array of nonvolatile memory cells, wherein each memory cell is programmable relative to one of a series of demarcation threshold voltages that corresponds to one of multiple memory states, a method of sensing in parallel via associated bit lines a group of the memory cells, comprising:

(a) selecting a previously unselected demarcation threshold voltage in the series, as a selected demarcation threshold voltage relative to which cycles of alternate program and verify phases are to be performed;
(b) setting up the memory cells to be program-inhibited in the group of memory cells by setting the bit lines of the memory cells to be program-inhibited to a first predetermined voltage while setting up the memory cells to be programmed in the group of memory cells by setting the bit lines of the memory cells to be programmed a second predetermined voltage at a beginning of the program phase;
(c) programming the group of memory cells in parallel with a programming pulse;
(d) discharging the bit lines of the memory cells that have not been program-inhibited;
(e) sensing the group of memory cells in parallel to determine if each of the memory cells has been program-verified;
(f) repeating (b) to (e) until all the memory cells have been programmed beyond the selected demarcation threshold voltage;
(g) repeating (a) to (f) until all demarcation threshold voltage in the series have been selected.

2. The method of claim 1, further comprising:
providing a switch between each memory cell and its associated bit line, said switch disconnecting said each memory cell from the associated bit line whenever the associated bit line is at the first predetermined voltage, and connecting said each memory cell to the associated bit line whenever the associated bit line is at the second predetermined voltage.

3. The method of claim 2, wherein a bit line is coupled to each memory cell of the group and those memory cells have their conduction currents turned off by having their bit lines disconnected when their bit line is at the first predetermined voltage.

4. The method of claim 1, wherein said sensing is part of a read operation to read said group of memory cells.

5. The method of claim 1, wherein said sensing is part of a program operation to verify if any of the memory cells has been programmed beyond the selected demarcation threshold voltage.

6. The method of any one of claims 1-5, wherein said series contains at least one demarcation threshold voltage.

7. The method of any one of claims 1-5, wherein said series contains at least two demarcation threshold voltages.

8. The method of any one of claims 1-5, wherein said sensing is part of a program verification.

* * * * *